(12) United States Patent
Hu

(10) Patent No.: US 11,496,105 B2
(45) Date of Patent: Nov. 8, 2022

(54) MULTI-STAGE AMPLIFIER CIRCUIT

(71) Applicant: Richtek Technology Corporation, Zhubei (TW)

(72) Inventor: Min-Hung Hu, New Taipei (TW)

(73) Assignee: RICHTEK TECHNOLOGY CORPORATION, Zhubei (TW)

(*) Notice: Subject to any disclaimer, the term of this patent is extended or adjusted under 35 U.S.C. 154(b) by 0 days.

(21) Appl. No.: 17/491,578

(22) Filed: Oct. 1, 2021

(65) Prior Publication Data
US 2022/0116002 A1  Apr. 14, 2022

(30) Foreign Application Priority Data
Oct. 8, 2020  (TW) .................... 109135066

(51) Int. Cl.
*H03F 3/45*  (2006.01)

(52) U.S. Cl.
CPC ... *H03F 3/45269* (2013.01); *H03F 2200/375* (2013.01)

(58) Field of Classification Search
CPC ................................................. H03F 3/45269
See application file for complete search history.

(56) References Cited

U.S. PATENT DOCUMENTS

| | | | | |
|---|---|---|---|---|
| 3,859,557 A * | 1/1975 | Grant | ..................... | H03K 4/696 315/395 |
| 4,480,230 A * | 10/1984 | Brehmer | ............. | H03F 3/45188 330/264 |
| 4,656,435 A * | 4/1987 | Czarniak | ............... | H03F 3/3001 330/264 |
| 5,182,525 A * | 1/1993 | Theus | ..................... | H03F 1/523 330/253 |
| 6,316,970 B1 * | 11/2001 | Hebert | ............... | H03F 3/45618 327/67 |
| 6,333,623 B1 | 12/2001 | Heisley et al. | | |
| 7,102,438 B1 * | 9/2006 | Colleran | ................... | H03F 1/30 330/69 |

* cited by examiner

*Primary Examiner* — Patricia T Nguyen
(74) *Attorney, Agent, or Firm* — Tung & Associates

(57) ABSTRACT

A multi-stage amplifier circuit includes a pre-stage amplifier circuit and a floating control circuit. The pre-stage amplifier circuit amplifies a voltage difference between its input terminals, to generate plural pre-stage transconductance currents flowing through corresponding plural pre-stage transconductance nodes. The floating control circuit includes: a floating reference transistor configured as a source follower and a floating amplifier. The floating amplifier and the floating reference transistor are coupled to form feedback control and to generate an upper driving signal and a lower driving signal according to a floating reference level in the floating control circuit. The upper driving signal is higher than the lower driving signal with a predetermined voltage difference. The floating control circuit is electrically connected to the plural pre-stage transconductance nodes and is floating in common mode relative to the pre-stage transconductance nodes.

19 Claims, 16 Drawing Sheets

MULTI-STAGE AMPLIFIER CIRCUIT

CROSS REFERENCE

The present invention claims priority to TW 109135066 filed on Oct. 8, 2020.

BACKGROUND OF THE INVENTION

Field of Invention

The present invention relates to an amplifier circuit; particularly, it relates to a multi-stage amplifier circuit with output stage floating control function. The present invention also relates to an output stage floating control circuit of the multi-stage amplifier circuit.

Description of Related Art

Please refer to FIG. 1, which shows a schematic diagram of a conventional multi-stage amplifier circuit (i.e., conventional multi-stage amplifier circuit 101). The conventional multi-stage amplifier circuit 101 includes a pre-stage amplifier 70, which is an operational transconductance amplifier. The pre-stage amplifier 70 amplifies a voltage difference between a first input terminal IN1 and a second input terminal IN2 of the pre-stage amplifier 70, to generate a pre-stage output signal VO1. Subsequently, a level shifter circuit 80 capable of performing a level offset operation via a power source and a constant offset current generates an upper driving signal DRU and a lower driving signal DRL according to the pre-stage output signal VO1, for respectively driving an upper transistor MN1 and a lower transistor MP1 of an output stage circuit 90.

Please refer to FIG. 2, which shows a schematic diagram of a conventional multi-stage amplifier circuit (i.e., conventional multi-stage amplifier circuit 102). The conventional multi-stage amplifier circuit 102 is similar to the conventional multi-stage amplifier circuit 101, but is different in that: the level shifter circuit 80' of the conventional multi-stage amplifier circuit 102 performs level shift operation on the pre-stage output signal VO1 via a transistor MN2 which is configured as a source follower and a transistor MP2 which is configured as a diode, to generate the upper driving signal DRU and the lower driving signal DRL.

The prior art multi-stage amplifier circuit 101 shown in FIG. 1 and the prior art multi-stage amplifier circuit 102 shown in FIG. 2 have the following drawbacks that: because an extra level shifter circuit (i.e., 80 and 80') is required, there will be extra parasitic poles, which will undesirably affect the bandwidth of the multi-stage amplifier circuit. Besides, in a case where the upper transistor MN1 and the lower transistor MP1 of the output stage circuit 90 have a large size, in order to ensure stability of the multi-stage amplifier circuit, it will be required for the constant offset current of the level shifter circuit (i.e., 80 and 80') to be high, but this will undesirably cost more power consumption. Moreover, because the prior art multi-stage amplifier circuits 101 and 102 adopts a level shifter circuit (i.e., 80 and 80') to cancel the gate-source voltages of the upper transistor MN1 and the lower transistor MP1, the resulted gate-source voltage mismatches will adversely affect the output common-mode range and increase the likelihood of signal distortion.

The following prior arts are relevant to the present invention: "A compact power-efficient 3V CMOS rail-to-rail input/output operational amplifier for VLSI cell libraries" authored by R. Hogervorst; "Current gain high-frequency CMOS operational amplifiers" authored by M. Milkovic; "Datasheet of AD829" published by Analog Devices Inc.; "A high-performance micropower switched-capacitor filter" authored by R. Castello; U.S. Pat. No. 6,333,623, and "Analog Design Essentials" authored by Willy Sansen.

As compared to the prior arts in FIG. 1 and FIG. 2, the present invention is advantageous in that: the present invention provides an output stage floating control circuit which is substantially entirely floating. In addition to being capable of precisely control an upper transistor and a lower transistor of an output stage circuit, unwanted extra bandwidth loss can be avoided. Besides, the configuration of the present invention further includes an AC positive feedback expedition loop which, without affecting stability, can further increase the overall response speed of the multi-stage amplifier circuit. Furthermore, as compared to the prior art, because the multi-stage amplifier circuit of the present invention can operate under a relatively lower current, the present invention can significantly reduce power consumption.

SUMMARY OF THE INVENTION

From one perspective, the present invention provides a multi-stage amplifier circuit, comprising: a pre-stage amplifier, which is configured to operably amplify a voltage difference between a first input terminal and a second input terminal of the pre-stage amplifier, so as to generate a plurality of pre-stage transconductance currents flowing through a plurality of corresponding pre-stage transconductance nodes, wherein the plurality of pre-stage transconductance currents include a first pre-stage transconductance current and a second pre-stage transconductance current which are in-phase with each other; and a floating control circuit, which is configured to operably generate an upper driving signal and a lower driving signal according to the first pre-stage transconductance current and the second pre-stage transconductance current, wherein the floating control circuit includes a first sub-floating control circuit and a second sub-floating control circuit which are coupled to each other, wherein the first sub-floating control circuit and the second sub-floating control circuit are configured to operably generate a first sub-floating control signal and a second sub-floating control signal, respectively; wherein the first sub-floating control signal and the second sub-floating control signal correspond to one and the other of the upper driving signal and the lower driving signal, respectively; wherein the first sub-floating control circuit includes: a first floating reference transistor, which is configured to operably receive the first pre-stage transconductance current and which is configured as a source follower; and a first floating amplifier, which is coupled to the first floating reference transistor to form a feedback control loop, wherein the first floating amplifier is configured to operably generate the first sub-floating control signal according to a floating reference level in the floating control circuit by feedback control; wherein the first sub-floating control signal is configured to operably control a gate of the first floating reference transistor, and wherein the floating reference level is generated according to the second pre-stage transconductance current; wherein the first sub-floating control signal and the second sub-floating control signal are floating with reference to voltages at the plurality of corresponding pre-stage transconductance nodes, and wherein there is a predetermined voltage difference between the first sub-floating control signal and the second sub-floating control signal, wherein the predetermined voltage difference is correlated with a gate-source voltage of the first floating reference transistor.

In one embodiment, the predetermined voltage difference is determined according to the first pre-stage transconductance current.

In one embodiment, the first sub-floating control circuit is configured as one of the following arrangements: (1) the first floating amplifier is configured to operably regulate a drain voltage of the first floating reference transistor by feedback control, such that the drain voltage of the first floating reference transistor is correlated with the floating reference level in the floating control circuit, thereby generating the first sub-floating control signal; or (2) the first floating amplifier is configured to operably regulate a source voltage of the first floating reference transistor by feedback control, such that the source voltage of the first floating reference transistor is correlated with the floating reference level in the floating control circuit, thereby generating the first sub-floating control signal.

In one embodiment, a power source and an offset current of the first floating amplifier are generated from one or more of the plurality of pre-stage transconductance currents other than the first pre-stage transconductance current.

In one embodiment, the first sub-floating control circuit is configured as the arrangement (1); and wherein the first floating amplifier includes a first floating amplification transistor, which is configured as a source follower, wherein the first floating amplification transistor is offset by the second pre-stage transconductance current, wherein a gate of the first floating amplification transistor is configured to operably receive the drain voltage of the first floating reference transistor for feedback control, thus generating the first sub-floating control signal at a source of the first floating amplification transistor; wherein the source of the first floating amplification transistor is configured to operably receive the second pre-stage transconductance current and generate the floating reference level.

In one embodiment, all common mode voltages of the floating control circuit respond to the voltages of the plurality of corresponding pre-stage transconductance nodes in an in-phase manner.

In one embodiment, the floating control circuit forms a super node with reference to the plurality of corresponding pre-stage transconductance nodes.

In one embodiment, the floating control circuit further includes a compensation capacitor, which is coupled between a first internal node and a second internal node in the first floating amplifier; wherein: with reference to an outside of the first floating amplifier, a common mode voltage at the first internal node and a common mode voltage at the second internal node are respectively determined according to two of the plurality of pre-stage transconductance currents which are in-phase with one the other, and both the common mode voltage at the first internal node and the common mode voltage at the second internal node respond to the voltages of the plurality of corresponding pre-stage transconductance nodes in an in-phase manner; and with reference to an inside of the first floating amplifier, both the common mode voltage at the first internal node and the common mode voltage at the second internal node respond in a reversed-phase manner.

In one embodiment, a bandwidth of transient state response of the floating control circuit is lower than a bandwidth of transient state response of the multi-stage amplifier circuit.

In one embodiment, the floating control circuit further includes: a synchronous amplifier, which is configured to operably generate a synchronous amplification signal according to one of the upper driving signal and the lower driving signal; and a feedback capacitor, which is configured to operably couple the synchronous amplification signal to the other one of the upper driving signal and the lower driving signal; wherein the synchronous amplifier, the feedback capacitor, the second sub-floating control circuit and the first sub-floating control circuit constitute a voltage positive feedback loop, so as to expedite in-phase response of the upper driving signal and the lower driving signal, thus expediting transient state response of the multi-stage amplifier circuit.

In one embodiment, the synchronous amplifier includes: a synchronous transistor, which is offset by a third pre-stage transconductance current of the plurality of pre-stage transconductance currents, wherein the synchronous transistor is configured as a source follower, and wherein a gate of the synchronous transistor is configured to operably receive one of the upper driving signal and the lower driving signal, so as to generate the synchronous amplification signal at a source of the synchronous transistor; the synchronous transistor, the feedback capacitor, the second sub-floating control circuit and the first sub-floating control circuit constitute the voltage positive feedback loop.

In one embodiment, the multi-stage amplifier circuit further comprises: an output stage circuit, which is configured to operably generate an amplification output signal according to the upper driving signal and the lower driving signal, wherein the output stage circuit includes: an upper transistor and a lower transistor, which are coupled to each other by a configuration of a source follower wherein a source of the upper transistor is coupled to a source of the lower transistor, such that the upper transistor and the lower transistor are configured as an AB-stage output amplification circuit, wherein the upper transistor and the lower transistor are controlled by the upper driving signal and the lower driving signal, respectively, so as to generate the amplification output signal.

In one embodiment, the second sub-floating control circuit is configured as one of the following arrangements: (1) the second sub-floating control circuit includes: a second floating reference transistor, which is configured to operably receive the first pre-stage transconductance current and which is configured as a source follower; wherein a source of the first floating reference transistor is coupled to a source of the second floating reference transistor; and a second floating amplifier, which is configured to operably generate the second sub-floating control signal by feedback control according to the floating reference level in the floating control circuit; wherein the second sub-floating control signal is configured to operably control a gate of the second floating reference transistor; or (2) the second sub-floating control circuit includes: a floating control transistor, which is configured as a diode, wherein a source of the floating control transistor is coupled to the source of the first floating reference transistor, whereas, a drain of the floating control transistor is configured to operably generate the second sub-floating control signal.

In one embodiment, quiescent currents of the upper transistor and the lower transistor are determined according to an offset current of a differential amplification stage of the pre-stage amplifier.

In one embodiment, the pre-stage amplifier includes a plurality of push branches and a plurality of corresponding pull branches, wherein the floating control circuit is coupled between the plurality of push branches and the plurality of pull branches, and the floating control circuit is floating with reference to the plurality of push branches and the plurality of pull branches, wherein the plurality of pre-stage transconductance currents further include a fourth pre-stage transconductance current which is in reversed-phase with the first pre-stage transconductance current and a fifth pre-stage transconductance current which is in reversed-phase with the second pre-stage transconductance current; wherein the first pre-stage transconductance current and the fourth pre-stage transconductance current correspond to a first push branch of the plurality of push branches and a first pull branch of the plurality of pull branches, respectively, whereas, the second pre-stage transconductance current and the fifth pre-stage transconductance current correspond to a second push branch of the plurality of push branches and a second pull branch of the plurality of pull branches, respectively.

In one embodiment, the pre-stage amplifier includes a plurality of push branches and a plurality of corresponding pull branches, wherein the floating control circuit is coupled between the plurality of push branches and the plurality of pull branches, and the floating control circuit is floating with reference to the plurality of push branches and the plurality of pull branches, wherein the pre-stage amplifier includes a first load current and a second load current, both of which have a constant current level; wherein the first pre-stage transconductance current and the first load current correspond to a first push branch of the plurality of push branches and a first pull branch of the plurality of pull branches, respectively, whereas, the second pre-stage transconductance current and the second load current correspond to a second push branch of the plurality of push branches and a second pull branch of the plurality of pull branches, respectively.

From another perspective, the present invention provides a multi-stage amplifier circuit, comprising: a pre-stage amplifier, which is configured to operably amplify a voltage difference between a first input terminal and a second input terminal, so as to generate a plurality of pre-stage transconductance currents at a plurality of corresponding pre-stage transconductance nodes, wherein the plurality of pre-stage transconductance currents include: a first pre-stage transconductance current and a second pre-stage transconductance current which are in-phase with each other; and a floating control circuit, which is configured to operably generate an upper driving signal and a lower driving signal according to the first pre-stage transconductance current and the second pre-stage transconductance current, wherein the floating control circuit includes: a first sub-floating control circuit and a second sub-floating control circuit which are coupled to each other, wherein the first sub-floating control circuit and the second sub-floating control circuit are configured to operably generate a first sub-floating control signal and a second sub-floating control signal, respectively; wherein the first sub-floating control signal and the second sub-floating control signal correspond to one and the other one of the upper driving signal and the lower driving signal, respectively; wherein the first sub-floating control signal and the second sub-floating control signal are floating with reference to voltages at the plurality of corresponding pre-stage transconductance nodes, and wherein a predetermined voltage difference lies between the first sub-floating control signal and the second sub-floating control signal; wherein the floating control circuit includes: a synchronous amplifier, which is configured to operably generate a synchronous amplification signal according to one of the upper driving signal and the lower driving signal; and a feedback capacitor, which is configured to operably couple the synchronous amplification signal to the other one of the upper driving signal and the lower driving signal; wherein the synchronous amplifier, the feedback capacitor, the second sub-floating control circuit and the first sub-floating control circuit constitute a voltage positive feedback loop, so as to expedite in-phase response of the upper driving signal and the lower driving signal, thus expediting transient state response of the multi-stage amplifier circuit.

In one embodiment, the synchronous amplifier includes: a synchronous transistor, which is offset by a third pre-stage transconductance current of the plurality of pre-stage transconductance currents, wherein the synchronous transistor is configured as a source follower, and wherein a gate of the synchronous transistor is configured to operably receive one of the upper driving signal and the lower driving signal, so as to generate the synchronous amplification signal at a source of the synchronous transistor; the synchronous transistor, the feedback capacitor, the second sub-floating control circuit and the first sub-floating control circuit constitute the voltage positive feedback loop.

In one embodiment, the multi-stage amplifier circuit further comprises: an output stage circuit, which is configured to operably generate an amplification output signal according to the upper driving signal and the lower driving signal, wherein the output stage circuit includes: an upper transistor and a lower transistor, which are coupled to each other by a configuration of a source follower wherein a source of the upper transistor is coupled to a source of the lower transistor, such that the upper transistor and the lower transistor are configured as an AB-stage output amplification circuit, wherein the upper transistor and the lower transistor are controlled by the upper driving signal and the lower driving signal, respectively, so as to generate the amplification output signal.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
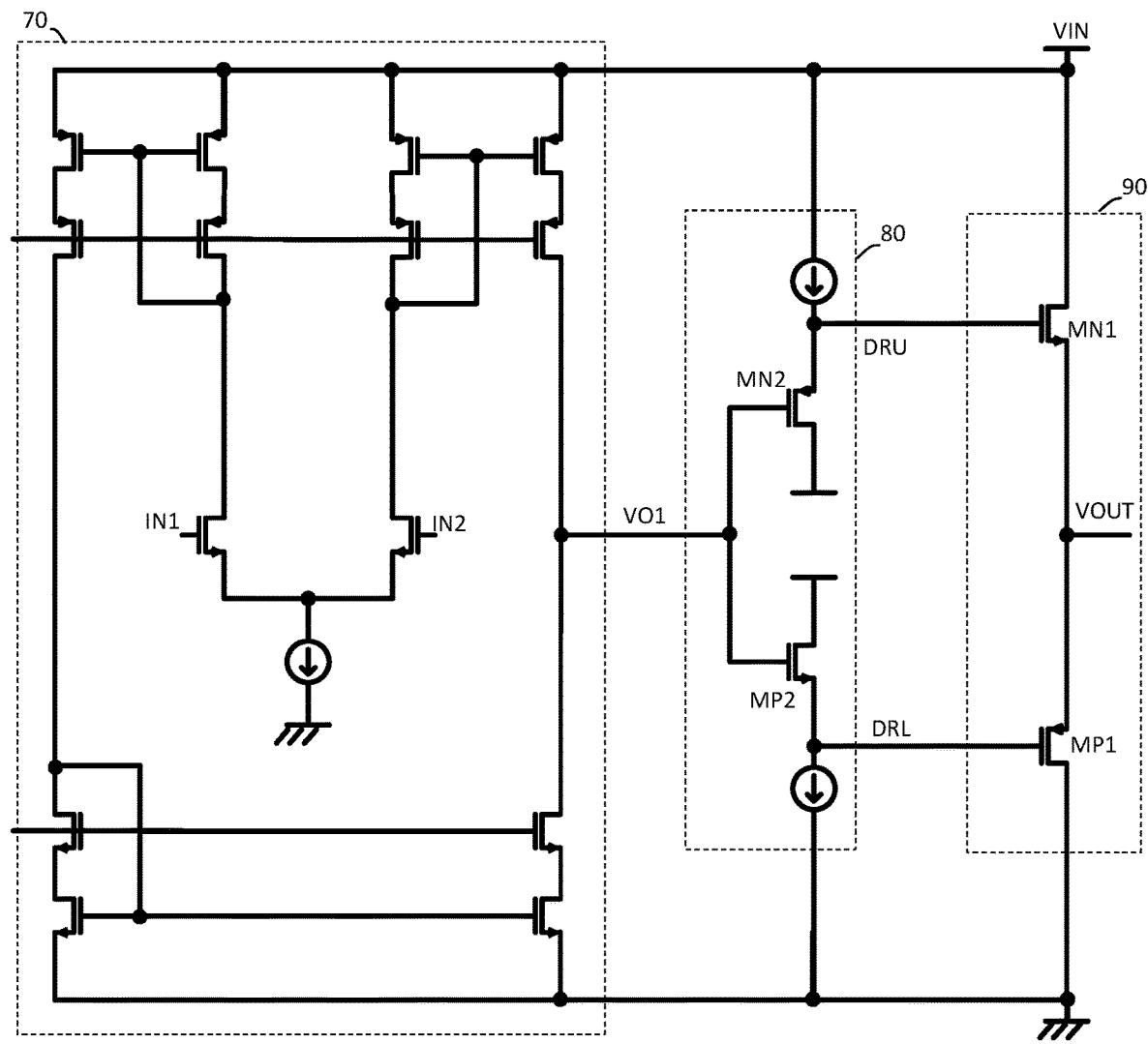
FIG. 1 shows a schematic diagram of a conventional multi-stage amplifier circuit.
Figure 2:
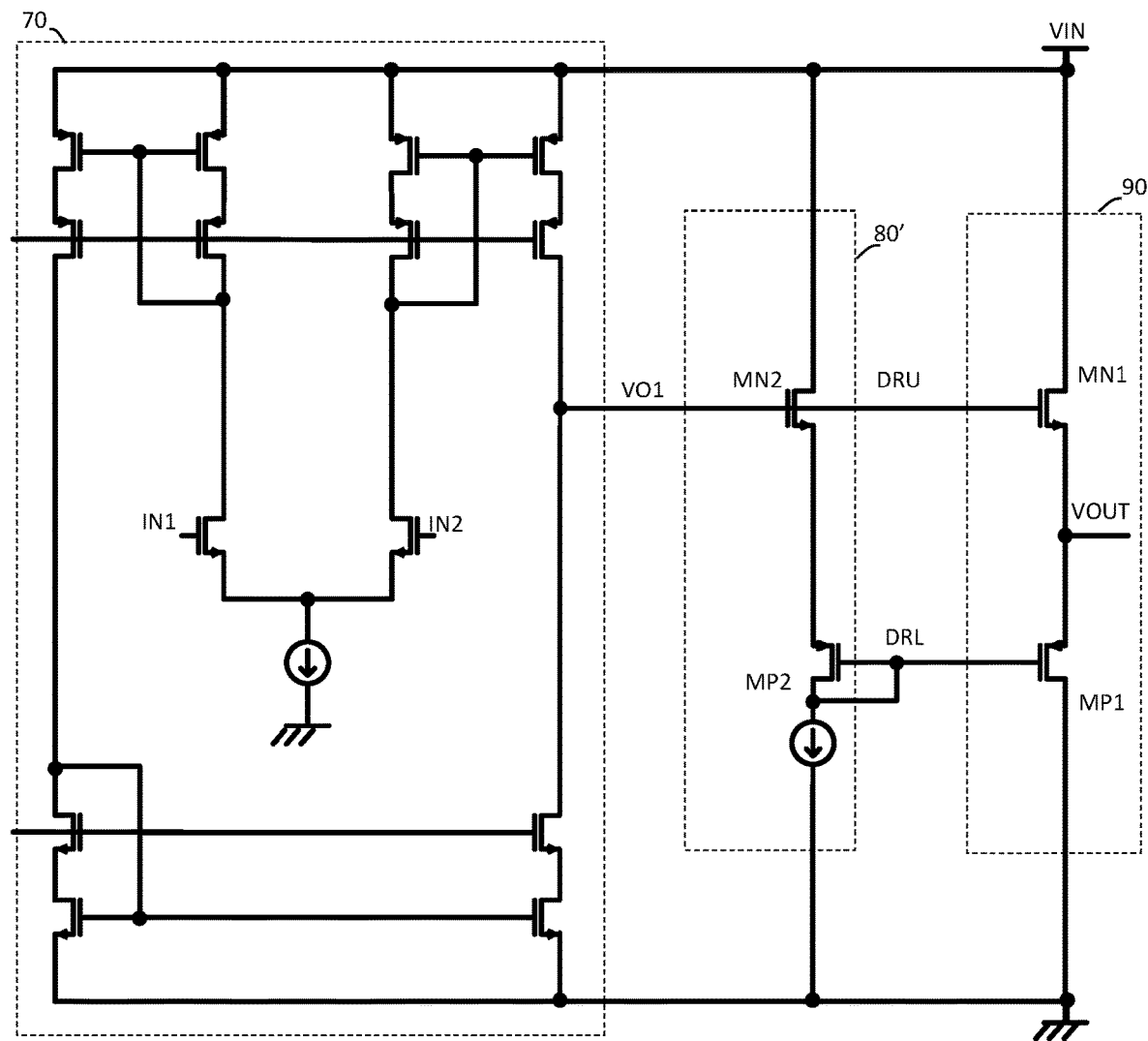
FIG. 2 shows a schematic diagram of a conventional multi-stage amplifier circuit.
Figure 3:
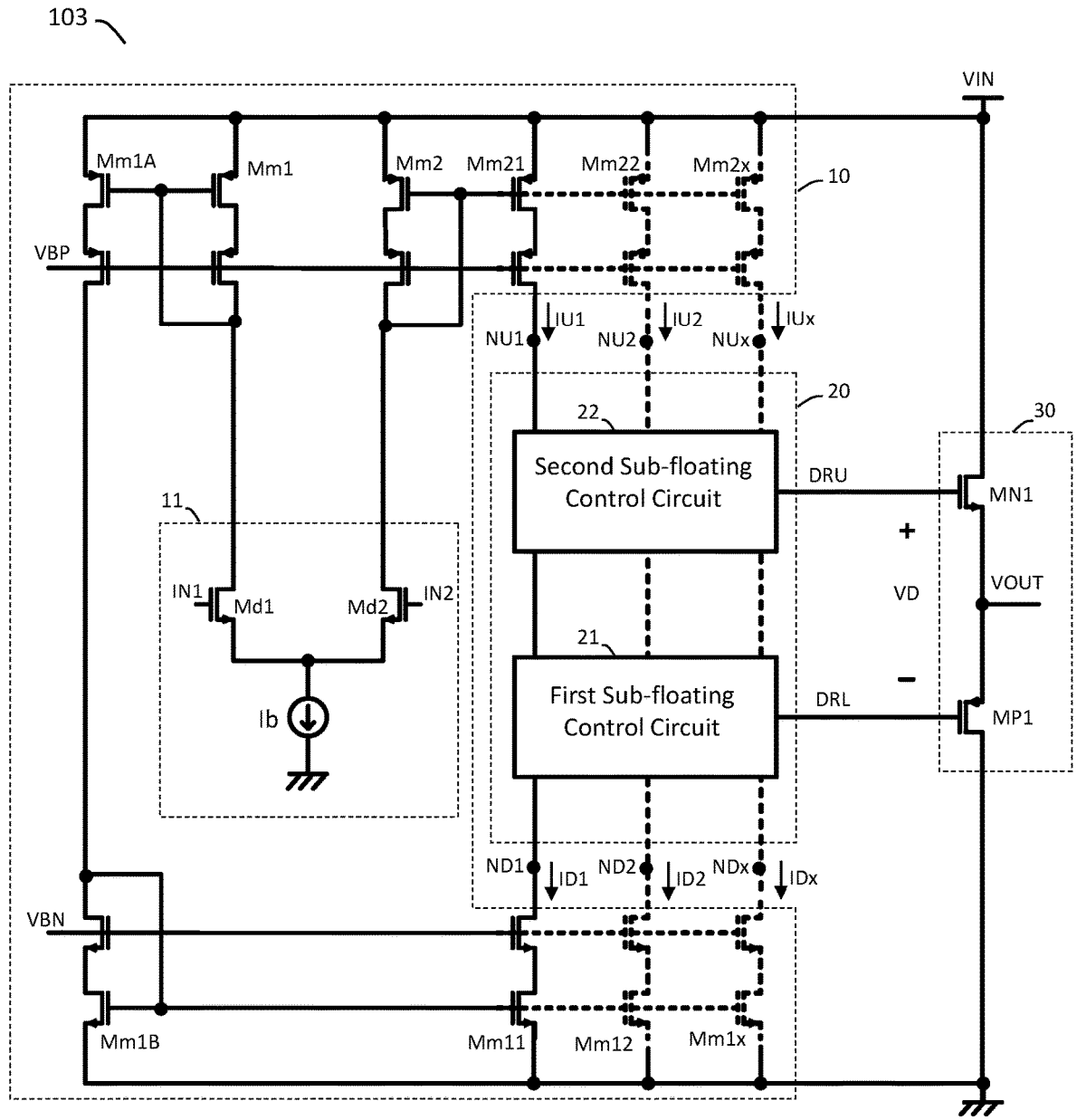
FIG. 3 shows a schematic diagram of a multi-stage amplifier circuit according to an embodiment of the present invention.

Please refer to FIG. 3, which shows a schematic diagram of a multi-stage amplifier circuit (i.e., multi-stage amplifier circuit 103) according to an embodiment of the present invention. The multi-stage amplifier circuit 103 comprises: a pre-stage amplifier 10 and a floating control circuit 20.

The pre-stage amplifier 10 is configured to operably transconduct and amplify a voltage difference between a first input terminal IN1 and a second input terminal IN2, so as to respectively generate plural corresponding pre-stage transconductance currents (i.e., pre-stage transconductance currents IU1-IUx and ID1-IDx) in plural branches through plural corresponding pre-stage transconductance nodes (i.e., pre-stage transconductance nodes NU1-NUx and ND1-NDx, wherein x denotes a positive integer greater than one). It is noteworthy that, in one embodiment, the above-mentioned pre-stage transconductance currents IU1 and ID1 respectively correspond to a push current (current of a push side) and a pull current (current of a pull side) flowing through one of the branches; the above-mentioned pre-stage transconductance currents IU2 and ID2 respectively correspond to a push current and a pull current flowing through another one of the branches; and so forth.

More specifically, in one embodiment, a transistor Md1 and a transistor Md2 are offset by an offset current Ib, such that the transistor Md1 and the transistor Md2 constitute a differential amplification stage 11. Transistors Mm1, Mm1A, Mm1B and Mm11-Mm1x are configured to operably generate the pre-stage transconductance currents of the push side, whereas, transistors Mm2 and Mm21-Mm2x are configured to operably generate the pre-stage transconductance currents of the pull side. In this embodiment, the pre-stage amplifier 10 is a fully differential transconductance amplifier circuit. Besides, the transistors which are offset by an offset voltage VBP and an offset voltage VBN are cascode transistors. Such cascode transistors provide a function to raise the output resistances of respective corresponding current branches, which is well known to those skilled in the art, so the details thereof are not redundantly explained here.

The floating control circuit 20 is configured to operably generate an upper driving signal DRU and a lower driving signal DRL according to the above-mentioned pre-stage transconductance currents IU1-IUx and ID1-IDx. The floating control circuit 20 includes a first sub-floating control circuit 21 and a second sub-floating control circuit 22 which are coupled to each other. The first sub-floating control circuit 21 and the second sub-floating control circuit 22 are configured to operably generate a first sub-floating control signal and a second sub-floating control signal, respectively. In this embodiment, the first sub-floating control signal and the second sub-floating control signal correspond to the upper driving signal DRU and the lower driving signal DRL, respectively. As shown in FIG. 3, in this embodiment, the first sub-floating control signal corresponds to the lower driving signal DRL, whereas, the second sub-floating control signal corresponds to the upper driving signal DRU.

Please still refer to FIG. 3. In one embodiment, the multi-stage amplifier circuit 103 further comprises an output stage circuit 30, which is configured to operably generate an amplification output signal VOUT according to the upper driving signal DRU and the lower driving signal DRL.

Figure 4:
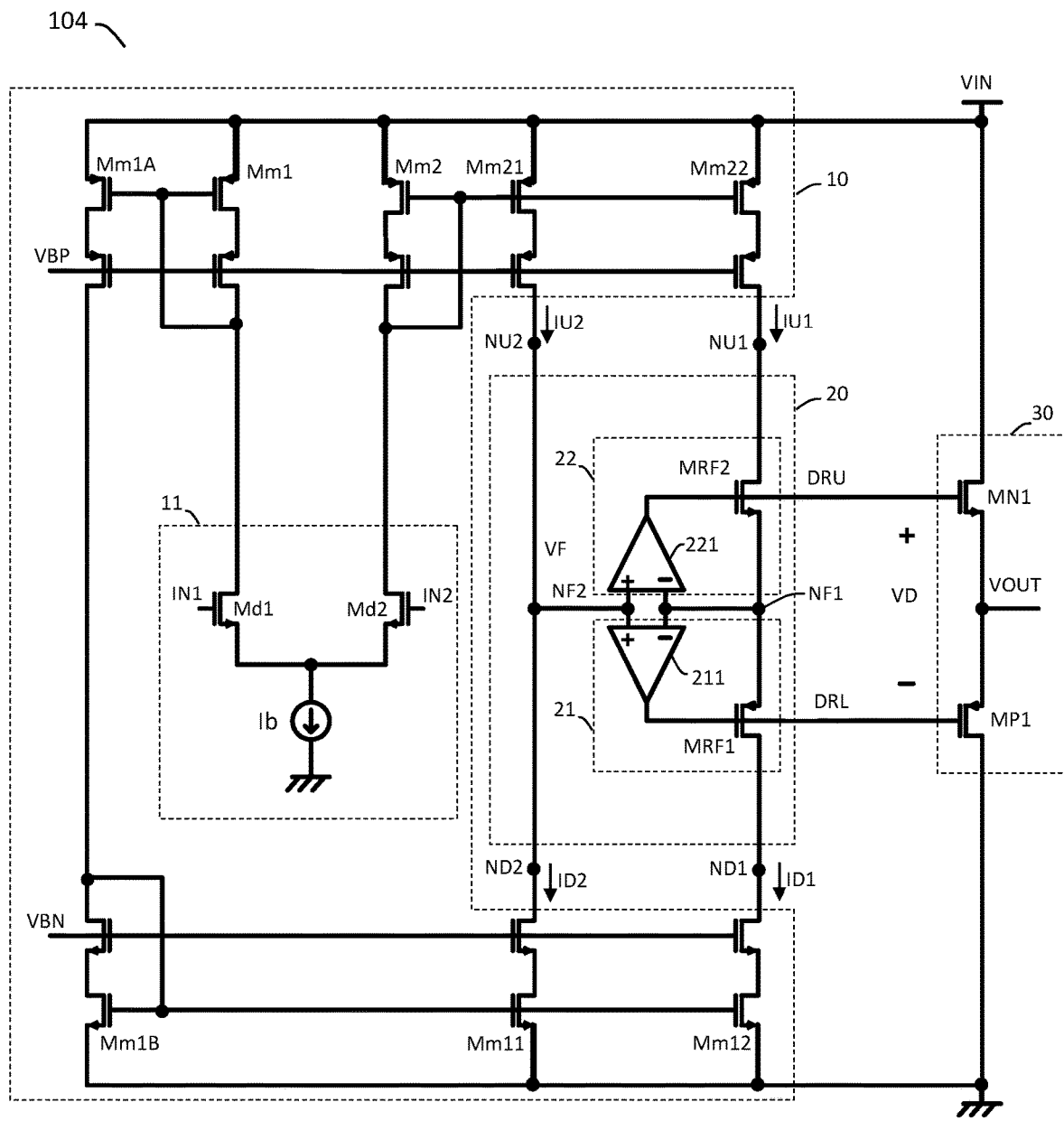
FIG. 4 shows a schematic diagram of a multi-stage amplifier circuit according to an embodiment of the present invention.

Please refer to FIG. 4, which shows a schematic diagram of a multi-stage amplifier circuit (i.e., multi-stage amplifier circuit 104) according to an embodiment of the present invention. In this embodiment, the pre-stage transconductance currents include: a first pre-stage transconductance current IU1 and a second pre-stage transconductance current IU2. The floating control circuit 20 is configured to operably generate the upper driving signal DRU and the lower driving signal DRL according to the first pre-stage transconductance currents IU1 and ID1 and the second pre-stage transconductance currents IU2 and ID2. In this embodiment, the first sub-floating control circuit 21 includes a floating reference transistor MRF1 and a floating amplifier 211. It is noteworthy that, in one embodiment, the floating control circuit 20 can generate the upper driving signal DRU and the lower driving signal DRL simply according to the first pre-stage transconductance current IU1 and the second pre-stage transconductance current IU2 in the absence of the first pre-stage transconductance current ID1 and the second pre-stage transconductance current ID2; the details of such implementation will be explained later.

The floating reference transistor MRF1 is configured to operably receive the first pre-stage transconductance current IU1 and is configured as a source follower. The floating amplifier 211 is coupled to the floating reference transistor MRF1 to feedback control the floating reference transistor MRF1. That is, the floating amplifier 211 generates the first sub-floating control signal according to a floating reference level VF in the floating control circuit 20, and the first sub-floating control signal (which corresponds to the lower driving signal DRL in this embodiment) controls a gate of the floating reference transistor MRF1. The floating reference level VF is generated according to the second pre-stage transconductance current IU2.

Please still refer to FIG. 4. In one embodiment, the second sub-floating control circuit 22 includes: a floating reference transistor MRF2 and a floating amplifier 221. In one embodiment, the floating reference transistor MRF2 and the floating amplifier 221 in the second sub-floating control circuit 22 are coupled to each other and controlled in a way similar to the floating reference transistor MRF1 and the floating amplifier 211 in the first sub-floating control circuit 21. The floating reference transistor MRF2 and the floating amplifier 221 are configured to operably generate the second sub-floating control signal (which corresponds to the upper driving signal DRU in this embodiment). The floating reference transistor MRF2 is configured as a source follower. The source of the floating reference transistor MRF2 and the source of the floating reference transistor MRF1 are coupled to a node NF1. In other embodiments, it is also practicable and within the scope of the present invention that the second sub-floating control circuit 22 can generate the second sub-floating control signal via other approaches.

Please still refer to FIG. 4. In this embodiment, the first floating amplifier 211 is configured to operably regulate a source voltage of the floating reference transistor MRF1 by feedback control, such that the source voltage of the floating reference transistor MRF1 is correlated with (positively correlated in this particular embodiment) the floating reference level VF in the floating control circuit 20, thereby generating the first sub-floating control signal.

In this embodiment, likewise, the second floating amplifier 221 is configured to operably regulate a source voltage of the floating reference transistor MRF2 by feedback control, such that the drain voltage of the floating reference transistor MRF2 is positively correlated with the floating reference level VF in the floating control circuit 20, thereby generating the second sub-floating control signal. In one embodiment, the source voltage of the floating reference transistor MRF2 is positively correlated with the floating reference level VF.

In this embodiment, the first sub-floating control signal and the second sub-floating control signal are floating with reference to voltages at the pre-stage transconductance nodes NU1-NUx and ND1-NDx. And, there is a predetermined voltage difference VD between the first sub-floating control signal and the second sub-floating control signal. In one embodiment, the predetermined voltage difference VD is correlated with a gate-source voltage of the floating reference transistor MRF1 or a gate-source voltage of the floating reference transistor MRF2. In one embodiment, the predetermined voltage difference VD is correlated with a sum of a gate-source voltage of the floating reference transistor MRF1 plus a gate-source voltage of the floating reference transistor MRF2. In one embodiment, as shown in FIG. 4, the predetermined voltage difference VD is determined according to the first pre-stage transconductance current IU1.

Please still refer to FIG. 4. In this embodiment, the output stage circuit 30 includes an upper transistor MN1 and a lower transistor MP1, which are coupled to each other in source follower configuration wherein the source of the upper transistor MN1 is coupled to the source of the lower transistor MP1, such that the upper transistor MN1 and the lower transistor MP1 are configured as an AB-stage output amplification circuit. The upper transistor MN1 and the lower transistor MP1 are controlled by the upper driving signal DRU and the lower driving signal DRL, respectively, so as to generate the amplification output signal VOUT.

The details as to how the present invention operates are now explained by using the embodiment shown in FIG. 4 as an example. In one embodiment, the gate of the floating reference transistor MRF1 is coupled to the gate of the lower transistor MP1, and the source of the floating reference transistor MRF1 and the source of the lower transistor MP1 are arranged at the same direction (at higher voltage side in this embodiment). From one perspective, when the floating reference transistor MRF1 and the lower transistor MP1 are in a steady state, the floating reference transistor MRF1 and the lower transistor MP1 can be regarded as a virtual current mirror. On the other hand, when the floating reference transistor MRF1 and the lower transistor MP1 are in a transient state, because there is a predetermined voltage difference VD between the upper driving signal DRU and the lower driving signal DRL (corresponding to the first sub-floating control signal and the second sub-floating control signal) and because the upper driving signal DRU and the lower driving signal DRL are floating with reference to voltages at the corresponding pre-stage transconductance nodes NU1-NUx and ND1-NDx, the floating reference transistor MRF1 and the lower transistor MP1 can control the upper transistor MN1 and the lower transistor MP1 to conduct a push-pull type operation, so as to generate the amplification output signal VOUT.

Besides, it is noteworthy that, because the present invention can regulate the floating reference transistors (i.e., MRF1 and MRF2) and control the upper transistor MN1 and/or the lower transistor MP1 of the output stage circuit 30 via the above-mentioned feedback operation, the present invention can significantly increase the transient state response speed and stability of the multi-stage amplifier circuit.

Moreover, in the above-mentioned configuration, quiescent currents of the upper transistor MN1 and the lower transistor MP1 of the output stage circuit 30 are determined according to an offset current Ib of a differential amplification stage 11 of the pre-stage amplifier 10.

Besides, it is noteworthy that, in one embodiment, as shown in FIG. 4, the upper transistor MN1 and the lower transistor MP1 are transistors which are complementary to each other. More specifically, in this embodiment, the upper transistor MN1 is an NMOS transistor, whereas, the lower transistor MP1 is a PMOS transistor. Under such situation, the floating reference transistor MRF1 is correspondingly a PMOS transistor (which is configured to operably control the P-type lower transistor MP1), whereas, the floating reference transistor MRF2 is correspondingly an NMOS transistor (which is configured to operably control the N-type upper transistor MN1).

Figure 5:
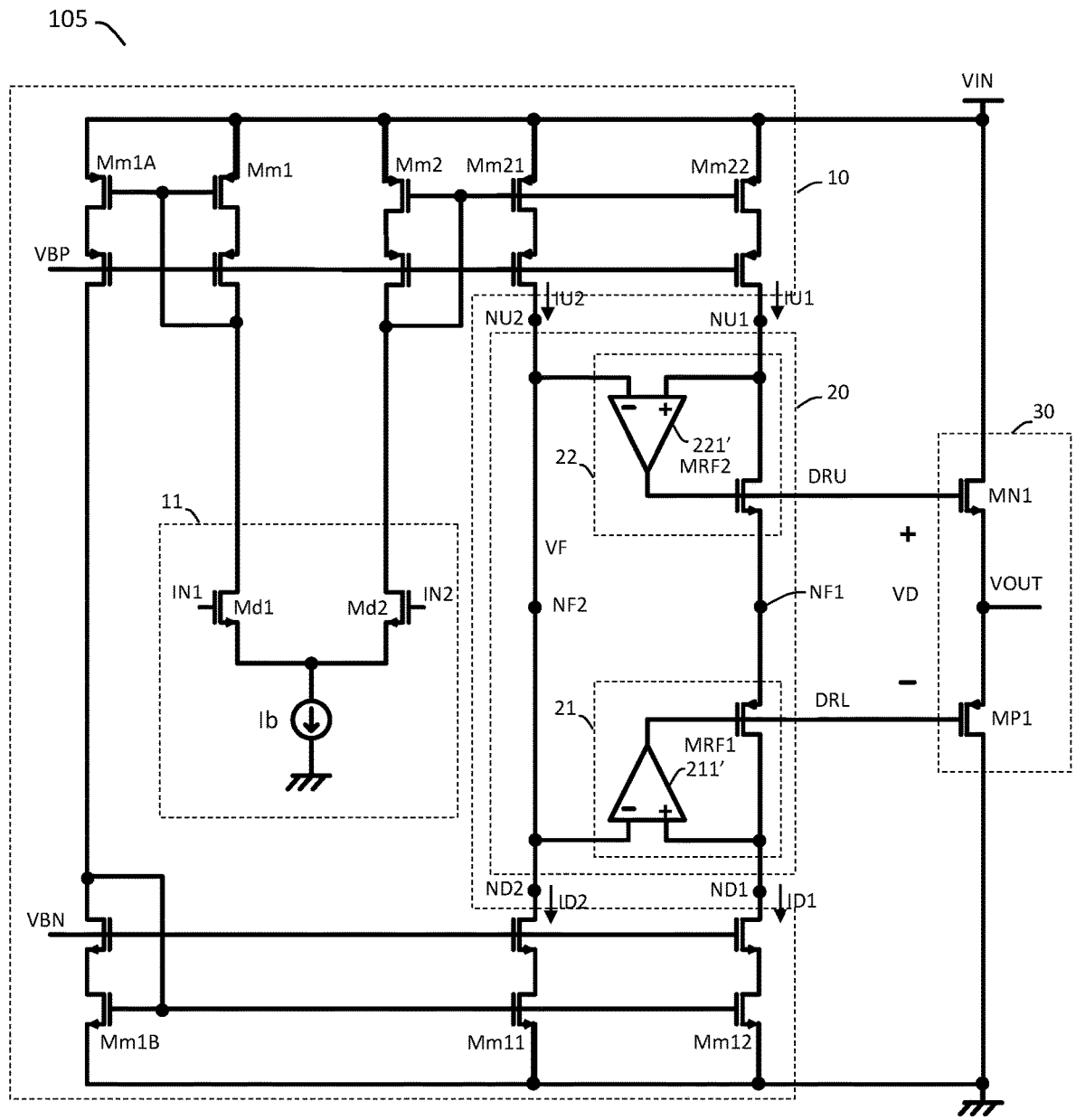
FIG. 5 shows a schematic diagram of a multi-stage amplifier circuit according to an embodiment of the present invention.

Please refer to FIG. 5, which shows a schematic diagram of a multi-stage amplifier circuit (i.e., multi-stage amplifier circuit 105) according to an embodiment of the present invention. In this embodiment, the floating amplifier 211' is configured to operably regulate a drain voltage of the floating reference transistor MRF1 by feedback control, such that the drain voltage of the floating reference transistor MRF1 is positively correlated with the floating reference level VF in the floating control circuit 20, thereby generating the first sub-floating control signal (which corresponds to the lower driving signal DRL in this embodiment). This embodiment of FIG. 5 is similar to the embodiment of FIG. 4, but is different in that: the terminals of the floating reference transistors (i.e., MRF1 and MRF2) that are regulated in this embodiment are different from those in the embodiment of FIG. 4. Although there is such difference, the multi-stage amplifier circuit 105 can still achieve all above-mentioned desired functions and efficacies as the multi-stage amplifier circuit 104.

In the above-mentioned implementation, as described above, the floating amplifier (e.g., 211 and 211') is configured to operably regulate a source voltage or a drain voltage of the floating reference transistor (e.g., MRF1) by feedback control, such that the source voltage or the drain voltage of the floating reference transistor (e.g., MRF1) is positively correlated with the floating reference level (e.g., VF) in the floating control circuit 20. In one embodiment, a positive input terminal and a negative input terminal of the floating amplifier (e.g., 211 and 211') can be regulated to have a voltage level equal to each other. In another embodiment, it can be regulated so that a predetermined offset voltage can lie between the positive input terminal and the negative input terminal of the floating amplifier; in this case the source voltage or the drain voltage of the floating reference transistor (e.g., MRF1) is regulated to be positively correlated with the floating reference level (e.g., VF), but not equal to the floating reference level (e.g., VF).

Besides, as shown in FIG. 4 and FIG. 5, the floating amplifier 221 and 221' can be implemented in a way similar to but complementary to the configuration of the floating amplifiers 211 and 211', to operably control a floating reference transistor MRF2 which is complementary to a floating reference transistor MRF1. In one embodiment, the above-mentioned configurations of the floating amplifiers (e.g., 211 and 211' shown in FIGS. 4; 221 and 221' shown in FIG. 5) can be implemented in combination. For example, the first sub-floating control circuit 21 shown in FIG. 4 can be combined with the second sub-floating control circuit 22 shown in FIG. 5, etc.

Figure 6A:
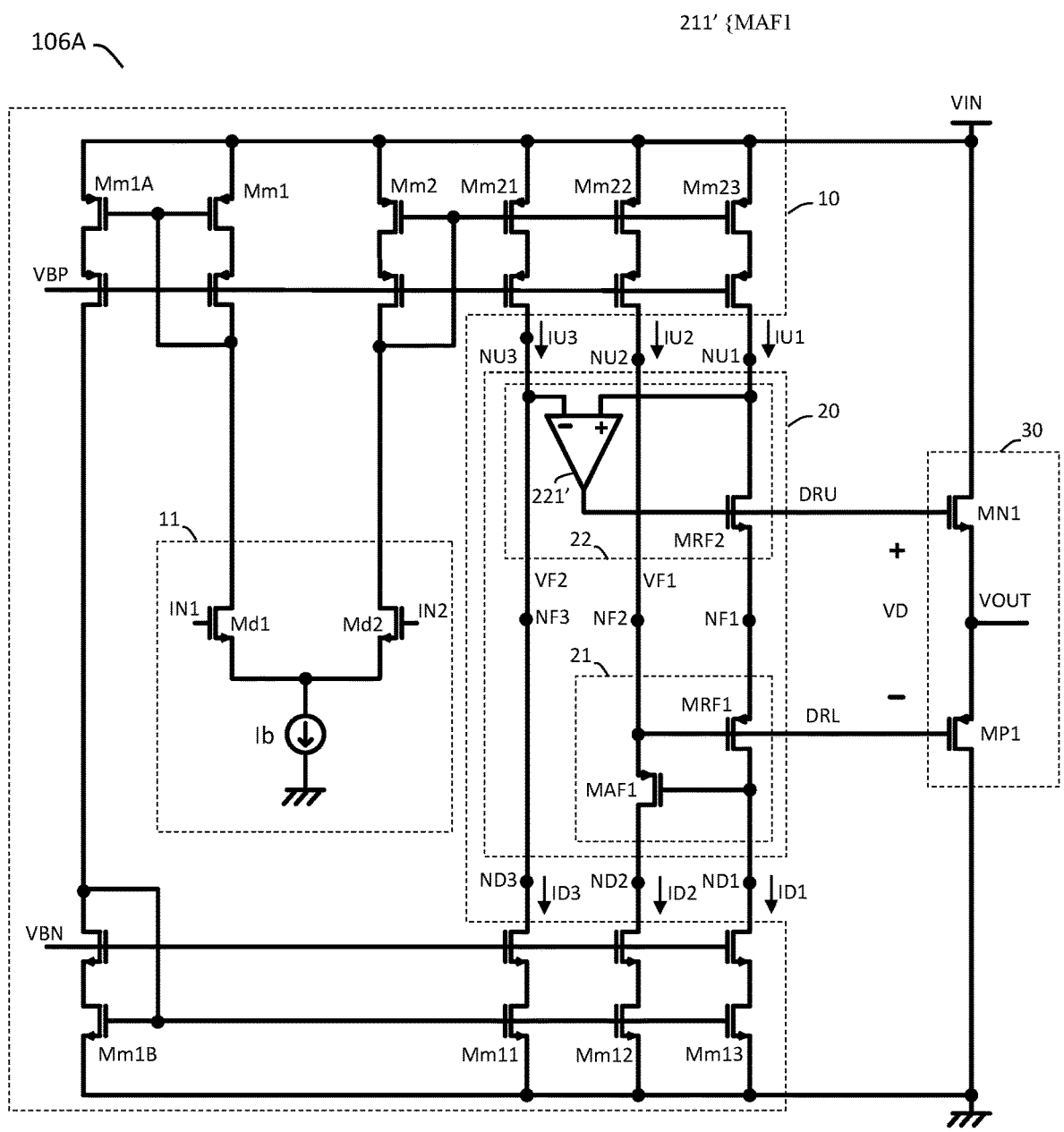
FIG. 6A shows a schematic diagram of a multi-stage amplifier circuit according to a specific embodiment of the present invention.

Please refer to FIG. 6A, which shows a schematic diagram of a multi-stage amplifier circuit (i.e., multi-stage amplifier circuit 106A) according to a specific embodiment of the present invention. In this embodiment, the floating amplifier 211' includes a floating amplification transistor MAF1, which is configured as a source follower. The floating amplification transistor MAF1 is offset by a second pre-stage transconductance current IU2. The gate of the floating amplification transistor MAF1 is configured to receive a drain voltage of the floating reference transistor MRF1 for feedback control operation, thus generating a first sub-floating control signal (which corresponds to the lower driving signal DRL in this embodiment) at the source of the floating amplification transistor MAF1. In this embodiment, the source of the floating amplification transistor MAF1 is configured to operably receive the second pre-stage transconductance current IU2 and generate a floating reference level VF1.

From one perspective, the floating amplification transistor MAF1 of the multi-stage amplifier circuit 106A is configured to operably regulate the drain voltage of the floating reference transistor MRF1 by feedback control, such that a difference between the drain voltage of the floating reference transistor MRF1 and the floating reference level VF1 becomes substantially equal to a gate-source voltage of the floating amplification transistor MAF1.

Figure 6B:
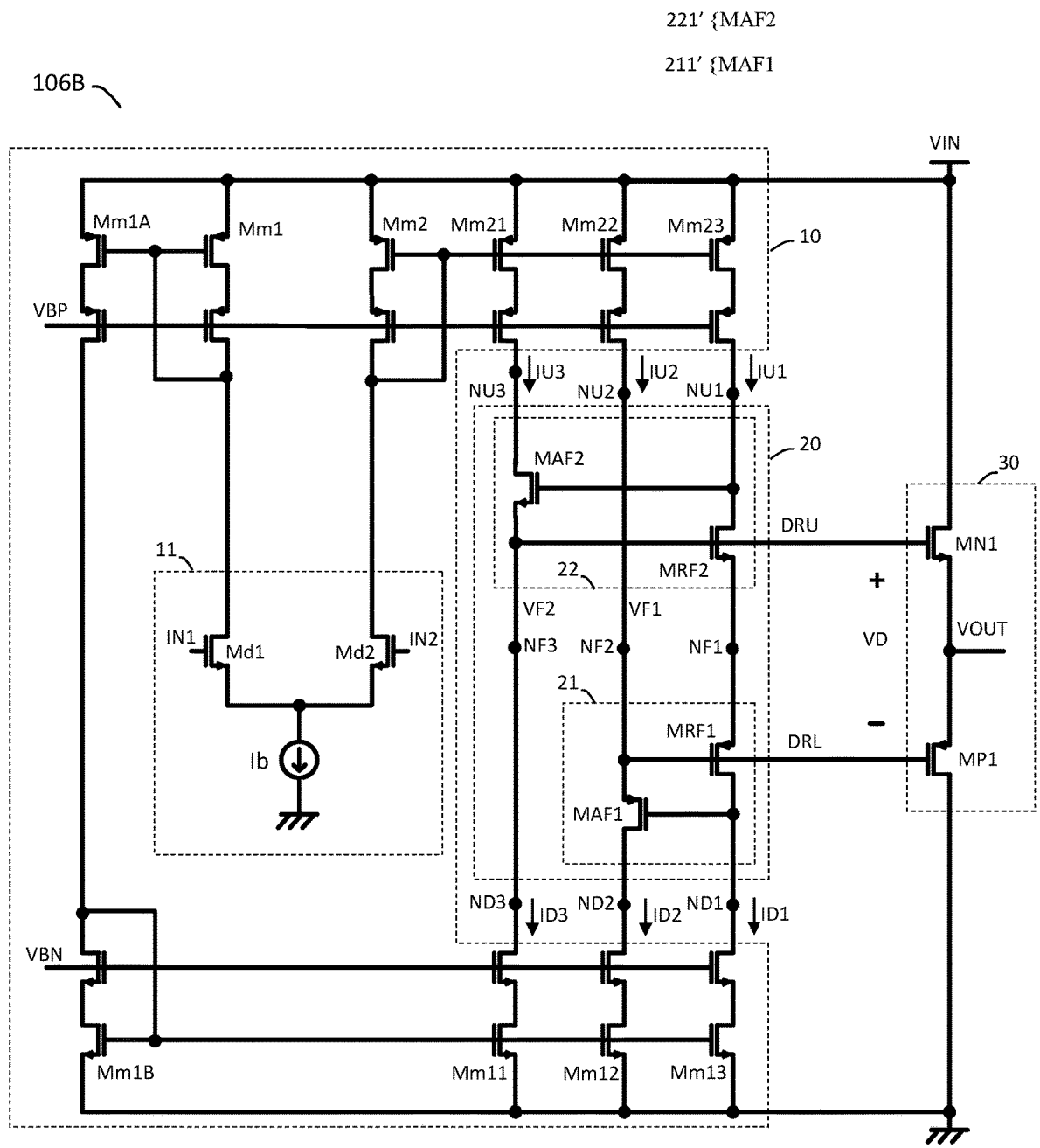
FIG. 6B shows a schematic diagram of a multi-stage amplifier circuit according to a more specific embodiment of the present invention.

Please refer to FIG. 6B, which shows a schematic diagram of a multi-stage amplifier circuit (i.e., multi-stage amplifier circuit 106B) according to a more specific embodiment of the present invention. This embodiment of FIG. 6B is similar to the multi-stage amplifier circuit 106A shown FIG. 6A, but is different in that: in the multi-stage amplifier circuit 106B of this embodiment, the floating amplifier 221' can be implemented in a way similar to but complementary to the configuration of a floating amplifier 211'. As shown in FIG. 6B, in this embodiment, the floating amplifier 221' includes a floating amplification transistor MAF2, which is configured as a source follower. The floating amplification transistor MAF2 is offset by a third pre-stage transconductance current IU3. The gate of the floating amplification transistor MAF2 is configured to operably receive a drain voltage of the floating reference transistor MRF2 for feedback control operation, thus generating the second sub-floating control signal (which corresponds to the upper driving signal DRU in this embodiment) at the source of the floating amplification transistor MAF2. In this embodiment, the source of the floating amplification transistor MAF2 is configured to operably receive the third pre-stage transconductance current IU3 and generate a floating reference level VF2.

From one perspective, the floating amplification transistor MAF2 of the multi-stage amplifier circuit 106B is configured to operably regulate the drain voltage of the floating reference transistor MRF2 by feedback control, such that a difference between the drain voltage of the floating reference transistor MRF2 and the floating reference level VF2 becomes substantially equal to a gate-source voltage of the floating amplification transistor MAF2.

In one embodiment, the power source and an offset current of the floating amplifier 211' are generated from one or more of the pre-stage transconductance currents of the pre-stage transconductance currents other than the first pre-stage transconductance current IU1. In the example of FIG. 6A, the floating amplification transistor MAF1 of the floating amplifier 211' is powered and offset by the second pre-stage transconductance current IU2, so as to execute the above-mentioned operation of amplification and regulation. For another example, in FIG. 6B, the floating amplification transistor MAF2 of the floating amplifier 221' is powered and offset by the third pre-stage transconductance current IU3, so as to execute the above-mentioned operation of amplification and regulation.

In one embodiment, the above-mentioned floating amplification transistor MAF1 is or includes a PMOS transistor, whereas, the above-mentioned floating amplification transistor MAF2 is or includes an NMOS transistor.

From one perspective, all common mode voltages of the floating control circuit 20 are determined according to the pre-stage transconductance currents; from another perspective, all common mode voltages of the floating amplifier 211 and the floating amplifier 221 are determined according to the pre-stage transconductance currents. In the examples of FIG. 4, FIG. 5, FIG. 6A and FIG. 6B, common mode voltages at the pre-stage transconductance nodes NU1-NUx, ND1-NDx and NF1-NFx are all determined according to the corresponding pre-stage transconductance currents IU1-IUx and ID1-IDx, respectively. In fact, the above-mentioned feature are also aligned with the description that "the first sub-floating control signal and the second sub-floating control signal are floating with reference to voltages at the corresponding pre-stage transconductance nodes". The above-mentioned "common mode voltage" refers to a voltage which corresponds to a ground node of the multi-stage amplifier circuit.

Moreover, the above-mentioned feature pertinent to the common mode voltage also causes the multi-stage amplifier circuit of the present invention to possess another feature: the floating control circuit 20 is floating with reference to the voltages at the pre-stage transconductance nodes NU1-NUx, ND1-NDx and NF1-NFx, or, the floating control circuit 20 is floating with reference to the pre-stage transconductance currents IU1-IUx and ID1-IDx. Accordingly, from another perspective, the floating control circuit 20 forms a "super node" with respect to the pre-stage transconductance nodes NU1-NUx, ND1-NDx and NF1-NFx or the pre-stage transconductance currents IU1-IUx and ID1-IDx of the corresponding branches. More specifically, the sum of all branch currents flowing through all branches coupled to the floating control circuit 20, excluding the floating control circuit 20 itself, is equal to zero.

Moreover, The above-mentioned features also lead to the following feature: in the present invention, all common mode voltages of the floating control circuit 20 respond to the voltages at the pre-stage transconductance nodes NU1-NUx, ND1-NDx and NF1-NFx in an in-phase manner.

Figure 7A:
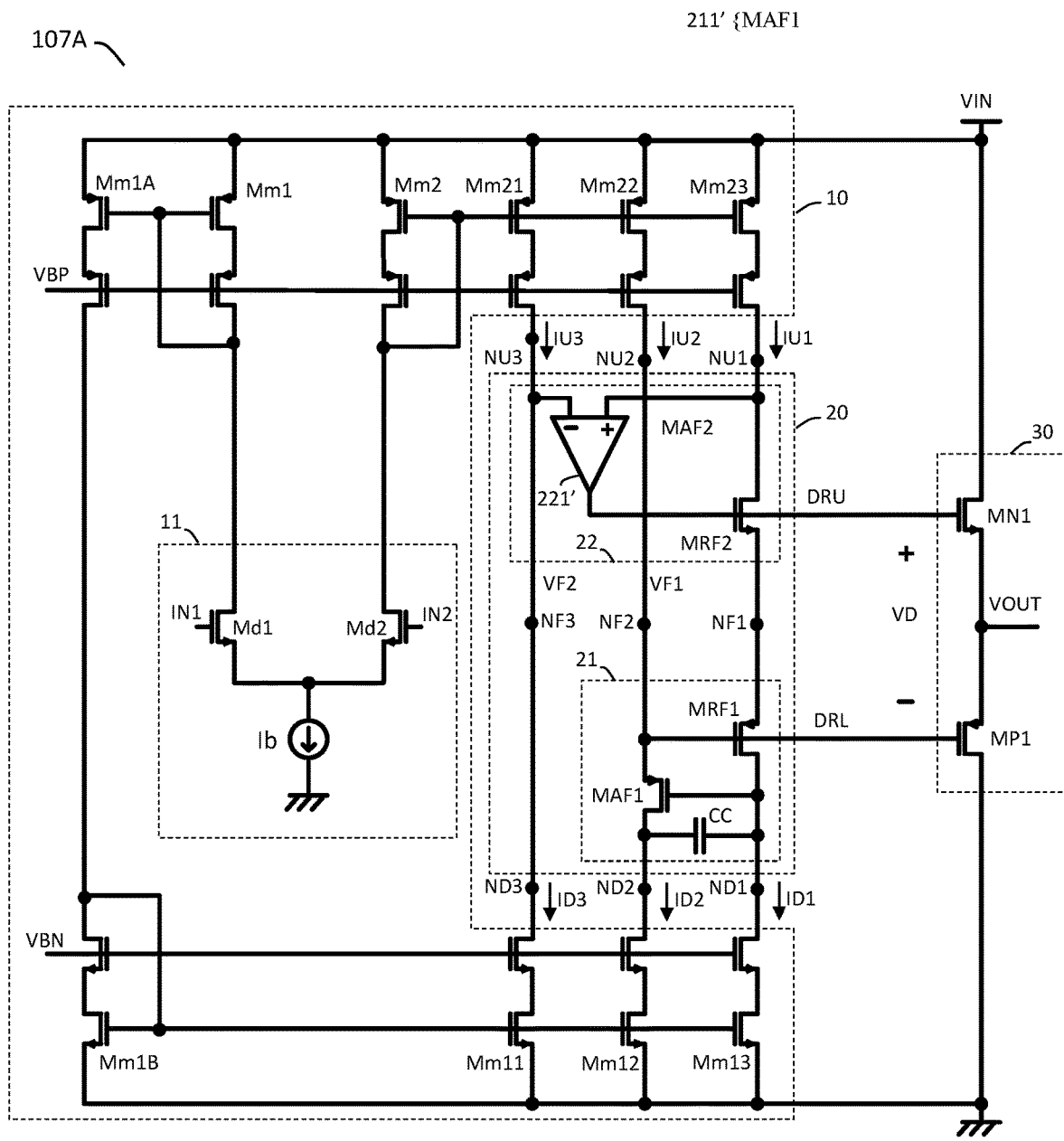
FIG. 7A and FIG. 7B show schematic diagrams of multi-stage amplifier circuits according to two embodiments of the present invention, respectively.
Figure 7B:
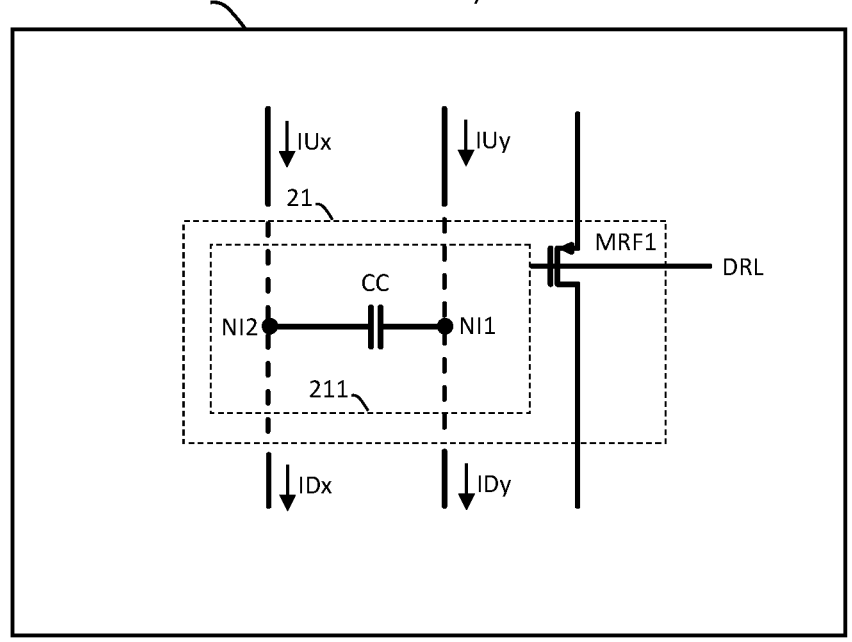

Please refer to FIG. 7A and FIG. 7B, which show schematic diagrams of a multi-stage amplifier circuit (i.e., multi-stage amplifier circuits 107A and 107B) according to two embodiments of the present invention, respectively. In these embodiments, the floating control circuit 20 further includes a compensation capacitor CC, which is coupled between a first internal node (e.g., ND1) and a second internal node (e.g., ND2) in the floating amplifier 211'. With reference to outside of the floating amplifier 211', the common mode voltage at the first internal node (ND1) and the common mode voltage at the second internal node (e.g., ND2) are respectively determined according to two pre-stage transconductance currents (e.g., IU1 and IU2) flowing through two current branches, and both the common mode voltages at the first internal node (e.g., ND1) and the second internal node (e.g., ND2) respond to the voltages at the corresponding pre-stage transconductance nodes in an in-phase manner. Besides, in this embodiment, with reference to inside of the first sub-floating control circuit 21, both the common mode voltages at the first internal node (e.g., ND1) and the second internal node (e.g., ND2) respond to the voltages at the corresponding pre-stage transconductance nodes in a reversed-phase manner.

It is noteworthy that, with reference to the voltage difference between the first input terminal IN1 and the second input terminal IN2 of the differential amplification stage 11, the pre-stage transconductance currents flowing through the corresponding branches (which are configured to operably determine respective corresponding common mode voltages) are in-phase among one another. For example, the pre-stage transconductance current IU1 and the pre-stage transconductance current IU2 are in-phase with each other. For another example, the pre-stage transconductance current ID1 and the pre-stage transconductance current ID2 are in-phase with each other. Or, from another perspective, the push-pull branches constituted by the pre-stage transconductance current IU1 and the pre-stage transconductance current ID1 (wherein IU1 is a push branch and ID1 is a pull branch) is in-phase with the push-pull branch constituted by the pre-stage transconductance current IU2 and the pre-stage transconductance current ID2 (wherein IU2 is a push branch and ID2 is a pull branch).

More specifically, taking the embodiment of FIG. 7A as an example, the compensation capacitor CC is coupled between the first internal node ND1 and the second internal node ND2 in the floating amplifier 211'. That is, the compensation capacitor CC is coupled between the gate and the drain (i.e., between the first internal node ND1 and the second internal node ND2) of the floating amplification transistor MAF1. With reference to the inside of the first sub-floating control circuit 21, the voltage at the gate of the floating amplification transistor MAF1 and the voltage at the drain of the floating amplification transistor MAF1 generate responses in reversed-phase; however, the voltage at the gate of the floating amplification transistor MAF1 and the voltage at the drain of the floating amplification transistor MAF1 both respond to the voltage changes at the pre-stage transconductance nodes caused by the pre-stage transconductance currents (e.g., IU1 and IU2) in an in-phase manner.

By the above-mentioned features of the present invention, the floating control circuit 20 or the sub-floating control circuit (e.g., the first sub-floating control circuit 21) is internally stable, while the pre-stage amplifier 10 can provide high-speed transient state response control on the output stage circuit 30. In one embodiment, a bandwidth of transient state response of the floating control circuit 20 can even be lower than a bandwidth of transient state response of the multi-stage amplifier circuit, and under such situation, the floating control circuit 20 can still achieve the above-mentioned efficacies.

Certainly, it should be understood that the above-mentioned preferred embodiment shown in FIG. 7A is only an illustrative example, but not for limiting the broadest scope of the present invention. In other embodiments, the efficacies of the present invention can also be achieved. For example as shown in FIG. 7B, the compensation capacitor CC in the first sub-floating control circuit 21 is coupled between a first internal node (e.g., NI1) and a second internal node (e.g., NI2) in the floating amplifier 211, and the circuitry also possess the above-mentioned in-phase amplification response and reversed-phase amplification response. This embodiment shown in FIG. 7B can also achieve the above-mentioned efficacies. In FIG. 7B, the numerical references IUx, IUy, IDx and IDy denote pre-stage transconductance currents pertinent to the first internal node (e.g., NI1) and the second internal node (e.g., NI2).

Figure 8:
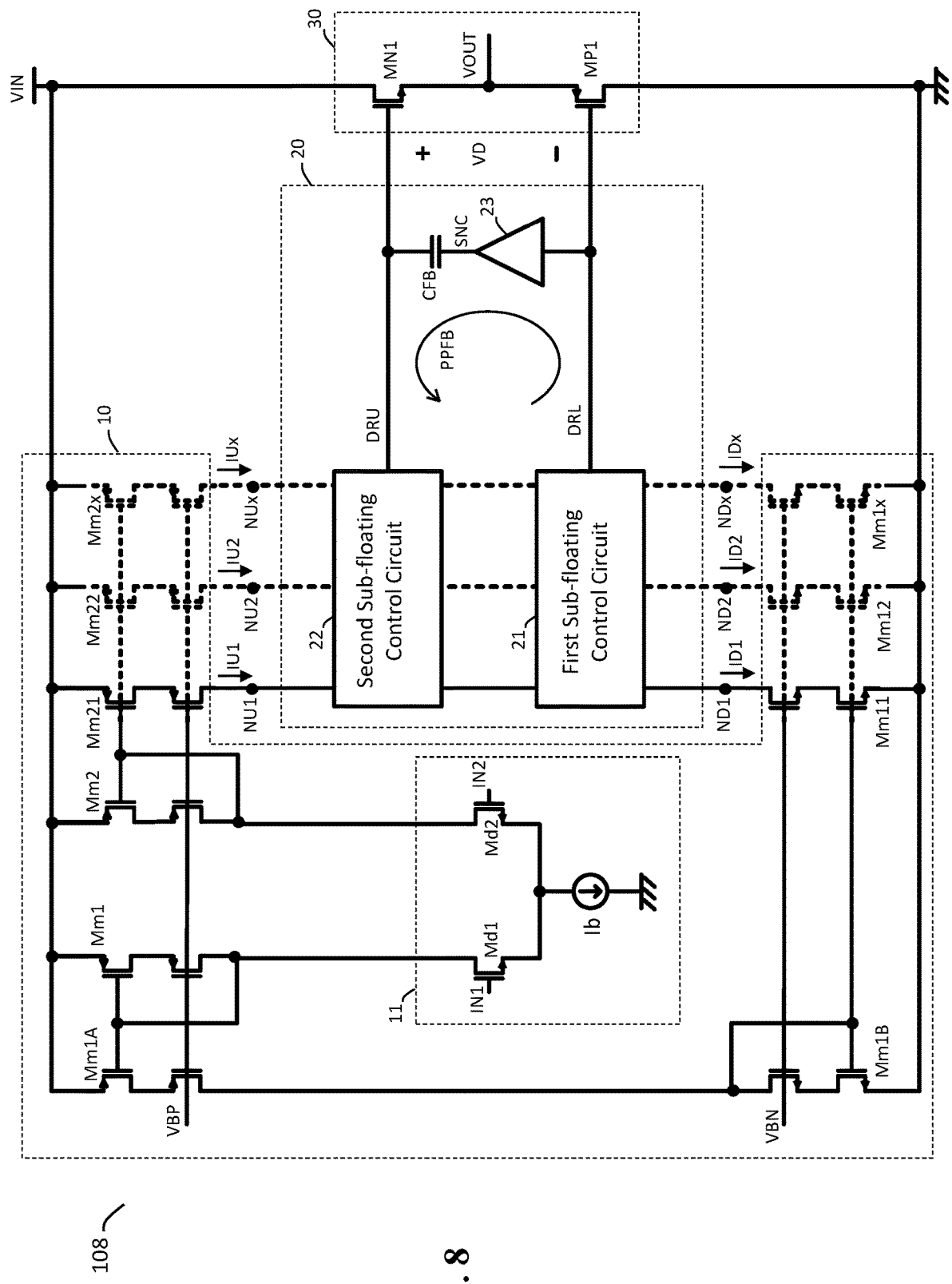
FIG. 8 shows a schematic diagram of a multi-stage amplifier circuit according to an embodiment of the present invention.

Please refer to FIG. 8, which shows a schematic diagram of a multi-stage amplifier circuit (i.e., multi-stage amplifier circuit 108) according to an embodiment of the present invention. In one embodiment, the floating control circuit 20 further includes: a synchronous amplifier 23 and a feedback capacitor CFB. The synchronous amplifier 23 is configured to operably generate a synchronous amplification signal SNC according to one of the upper driving signal DRU and the lower driving signal DRL. The feedback capacitor CFB is configured to operably couple the synchronous amplification signal SNC to the other one of the upper driving signal DRU and the lower driving signal DRL.

More specifically, in the embodiment of FIG. 8, the synchronous amplifier 23 is configured to operably generate the synchronous amplification signal SNC according to the lower driving signal DRL. The feedback capacitor CFB is configured to operably couple the synchronous amplification signal SNC to the upper driving signal DRU. The synchronous amplifier 23, the feedback capacitor CFB, the second sub-floating control circuit 22 and the first sub-floating control circuit 21 constitute a voltage positive feedback loop PPFB, so as to expedite in-phase response of the upper driving signal DRU and the lower driving signal DRL, thus expediting transient state response of the multi-stage amplifier circuit 108.

Figure 9A:
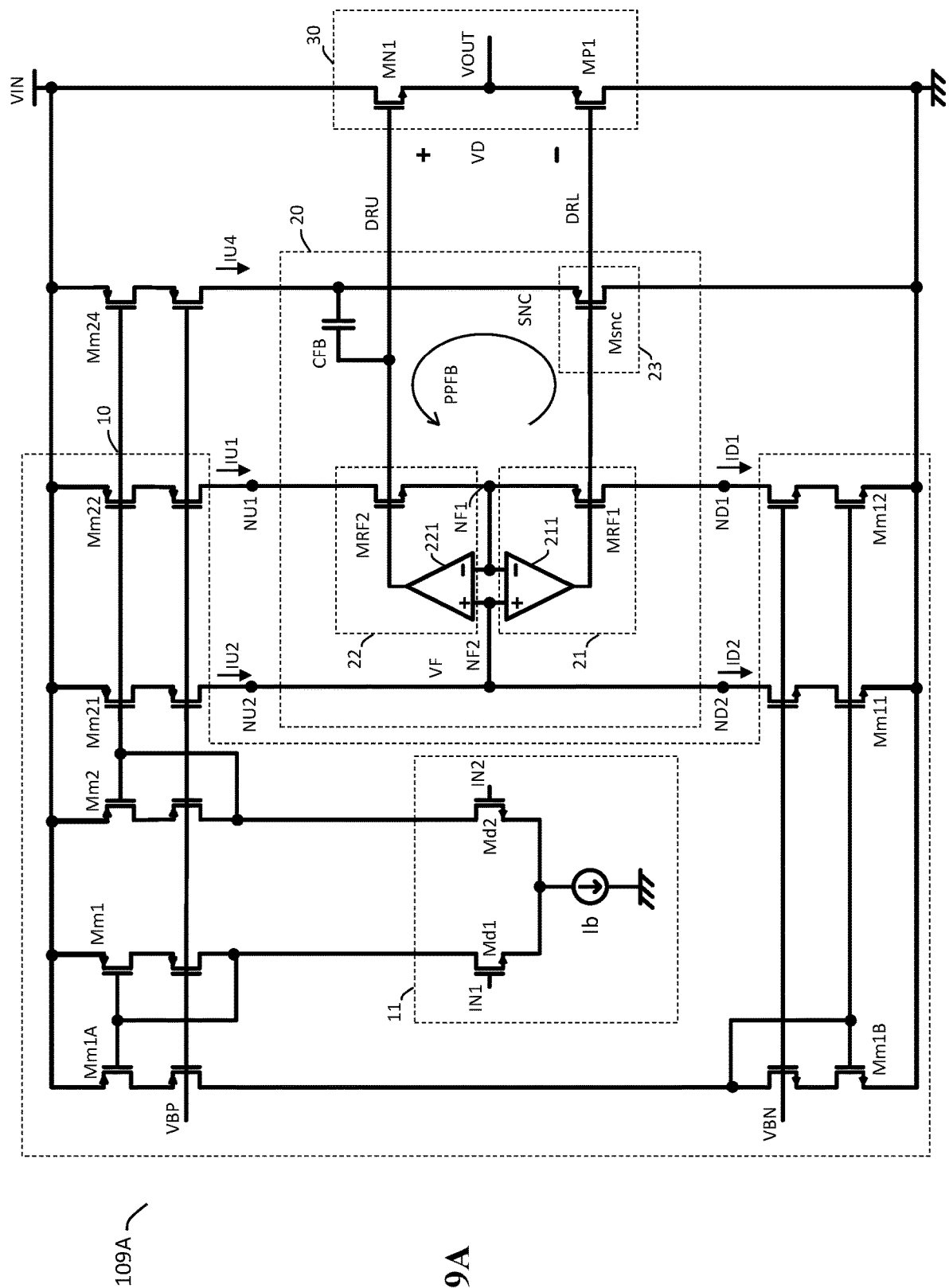
FIG. 9A and FIG. 9B show schematic diagrams of multi-stage amplifier circuits according to two embodiments of the present invention, respectively.
Figure 9B:
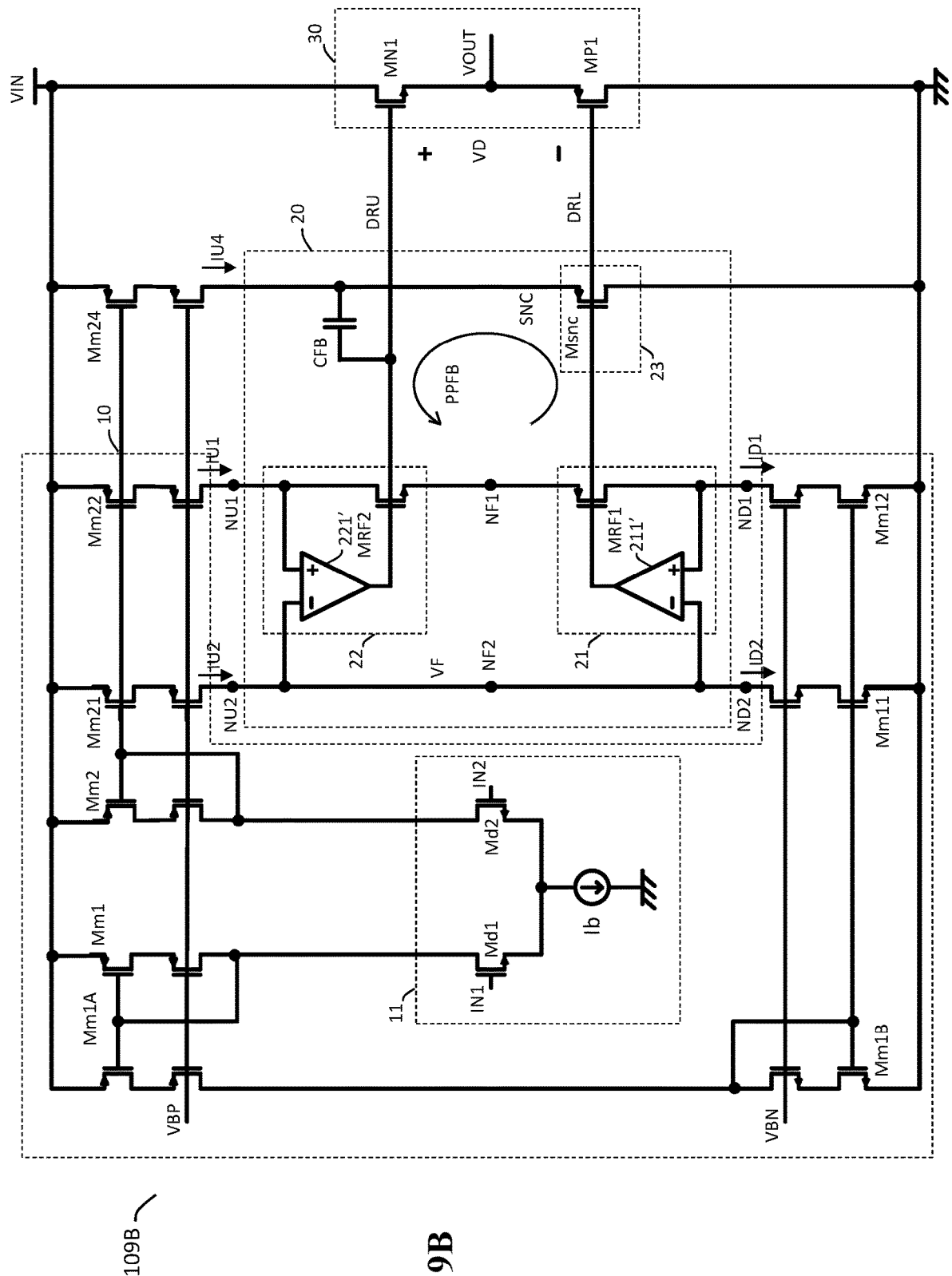
Figure 10:
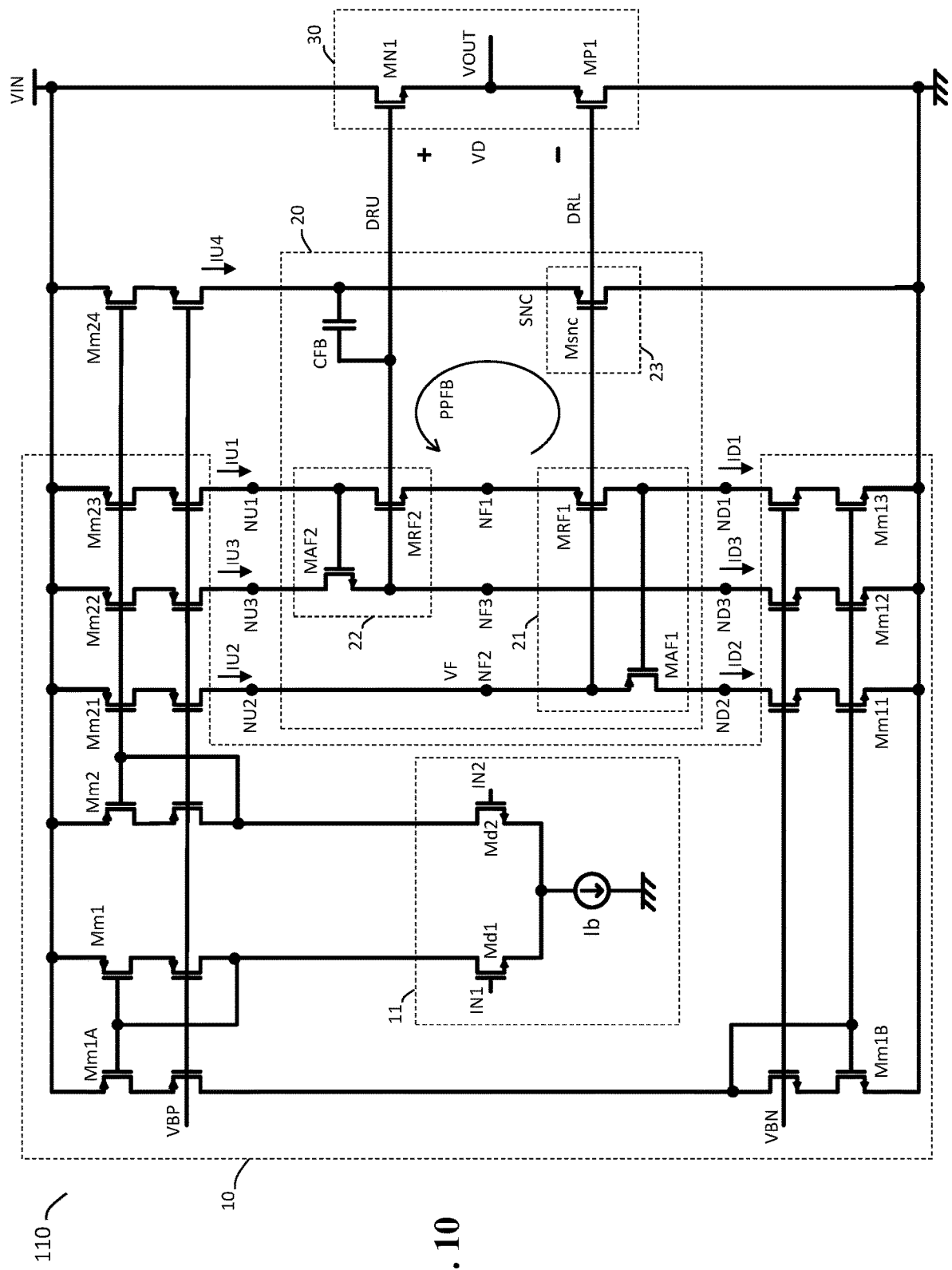
FIG. 10 shows a schematic diagram of a multi-stage amplifier circuit according to a specific embodiment of the present invention.

Please refer to FIG. 9A, FIG. 9B, and FIG. 10, which show schematic diagrams of a multi-stage amplifier circuit (i.e., multi-stage amplifier circuits 109A, 109B and 110) according to several embodiments of the present invention, respectively. In these embodiments, as shown in FIG. 9A and FIG. 9B, the synchronous amplifier 23 includes a synchronous transistor Msnc, which is offset by a pre-stage transconductance current IU4 of the pre-stage transconductance currents, wherein the synchronous transistor Msnc is configured as a source follower. In this embodiment, the gate of the synchronous transistor Msnc receives the lower driving signal DRL, so as to generate the synchronous amplification signal SNC at the source of the synchronous transistor Msnc, and the synchronous transistor Msnc transmits the synchronous amplification signal SNC to the upper driving signal DRU. As shown in FIG. 9A and FIG. 9B, the synchronous transistor Msnc, the feedback capacitor CFB, the second sub-floating control circuit 22 and the first sub-floating control circuit 21 constitute a voltage positive feedback loop PPFB, so as to expedite in-phase response of the upper driving signal DRU and the lower driving signal DRL, thus expediting transient state response of the multi-stage amplifier circuit (i.e., 109A and 109B). As shown in FIG. 10, the synchronous transistor Msnc, the feedback capacitor CFB, the floating reference transistor MRF2 and the floating reference transistor MRF1 constitute a voltage positive feedback loop PPFB.

Figure 11A:
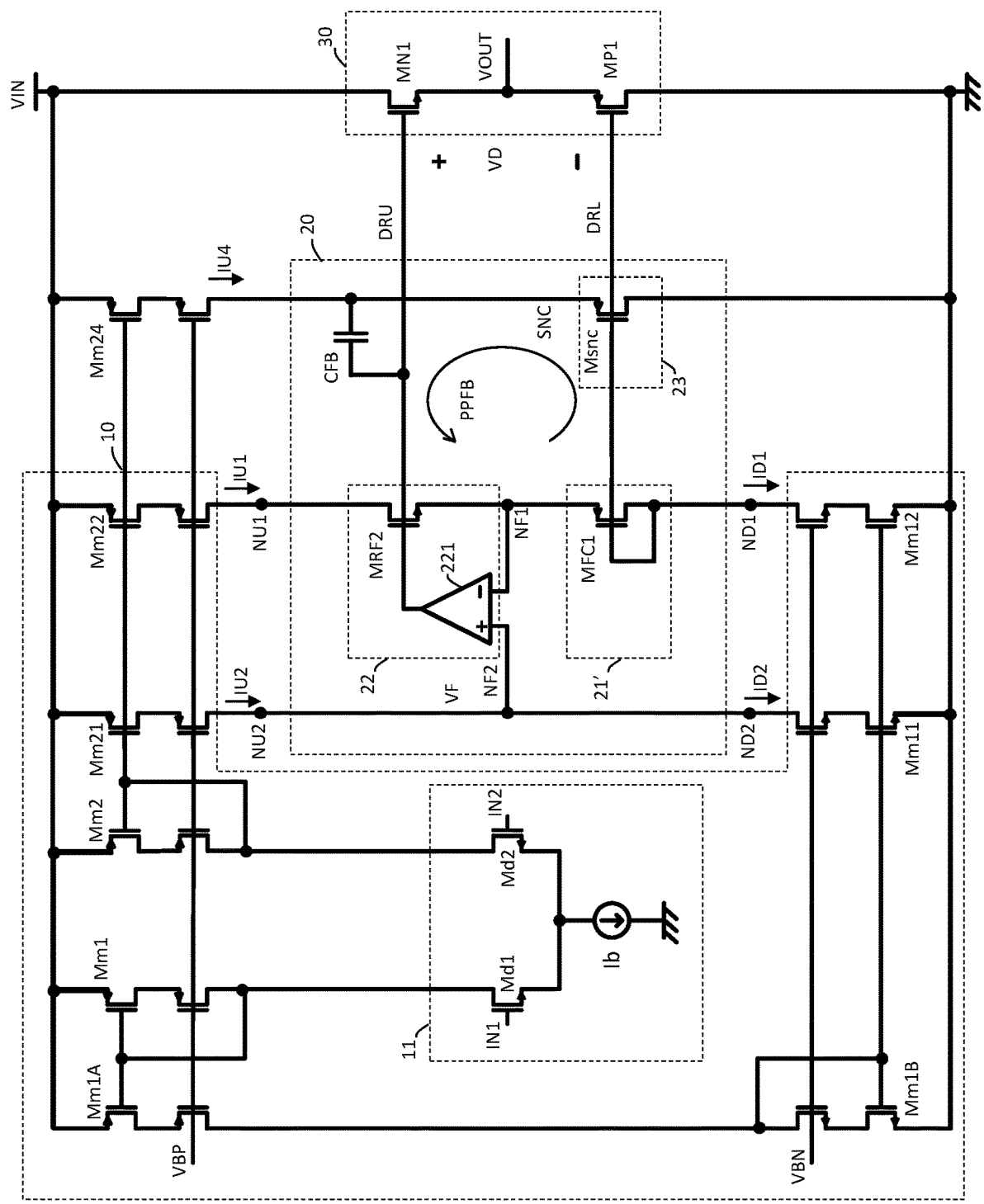
FIG. 11A and FIG. 11B show two embodiments of multi-stage amplifier circuits including a floating diode, respectively.
Figure 11B:
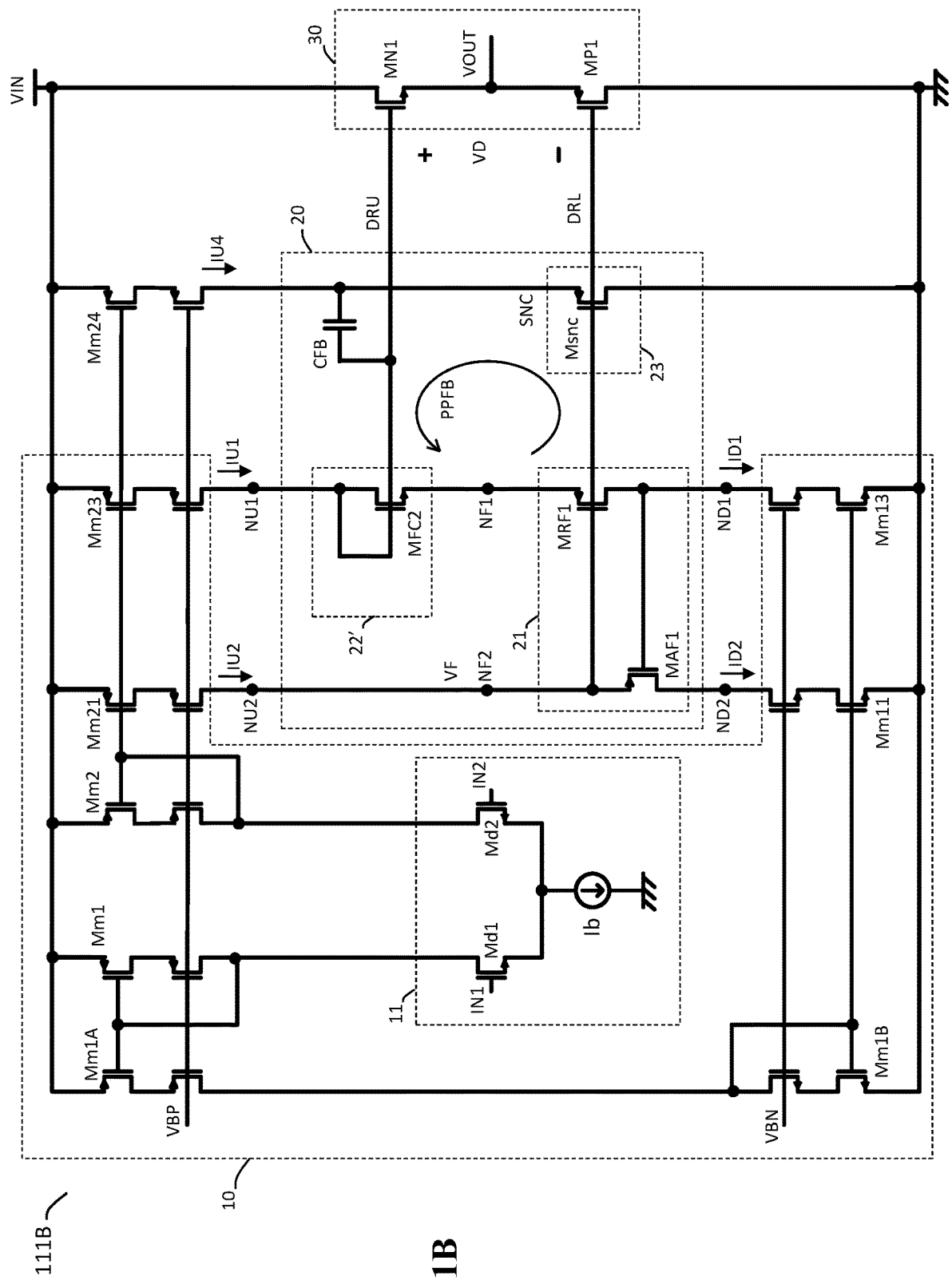

Please refer to FIG. 11A and FIG. 11B, which show two embodiments of a multi-stage amplifier circuit (i.e., multi-stage amplifier circuits 111A and 111B) including a floating diode, respectively. In one embodiment, one of the sub-floating control circuit of the floating control circuit 20 can be implemented as for example a diode-type level shifter circuit, which is simpler in circuitry. In the embodiments of FIG. 11A and FIG. 11B, the sub-floating control circuit (i.e., as shown by 21' in FIG. 11A or as shown by 22' in FIG. 11B) includes a floating control transistor MFC1 or MFC2, which is configured as a diode (i.e. diode-connected). The source of the floating control transistor MFC1 or MFC2 is coupled to the source of the floating reference transistor MRF1 or MRF2, whereas, the drain of the floating control transistor MFC1 or MFC2 is configured to operably generate the corresponding sub-floating control signal. The gate-source voltage of the floating control transistor MFC1 or MFC2 is determined according to the pre-stage transconductance current IU1.

Figure 12:
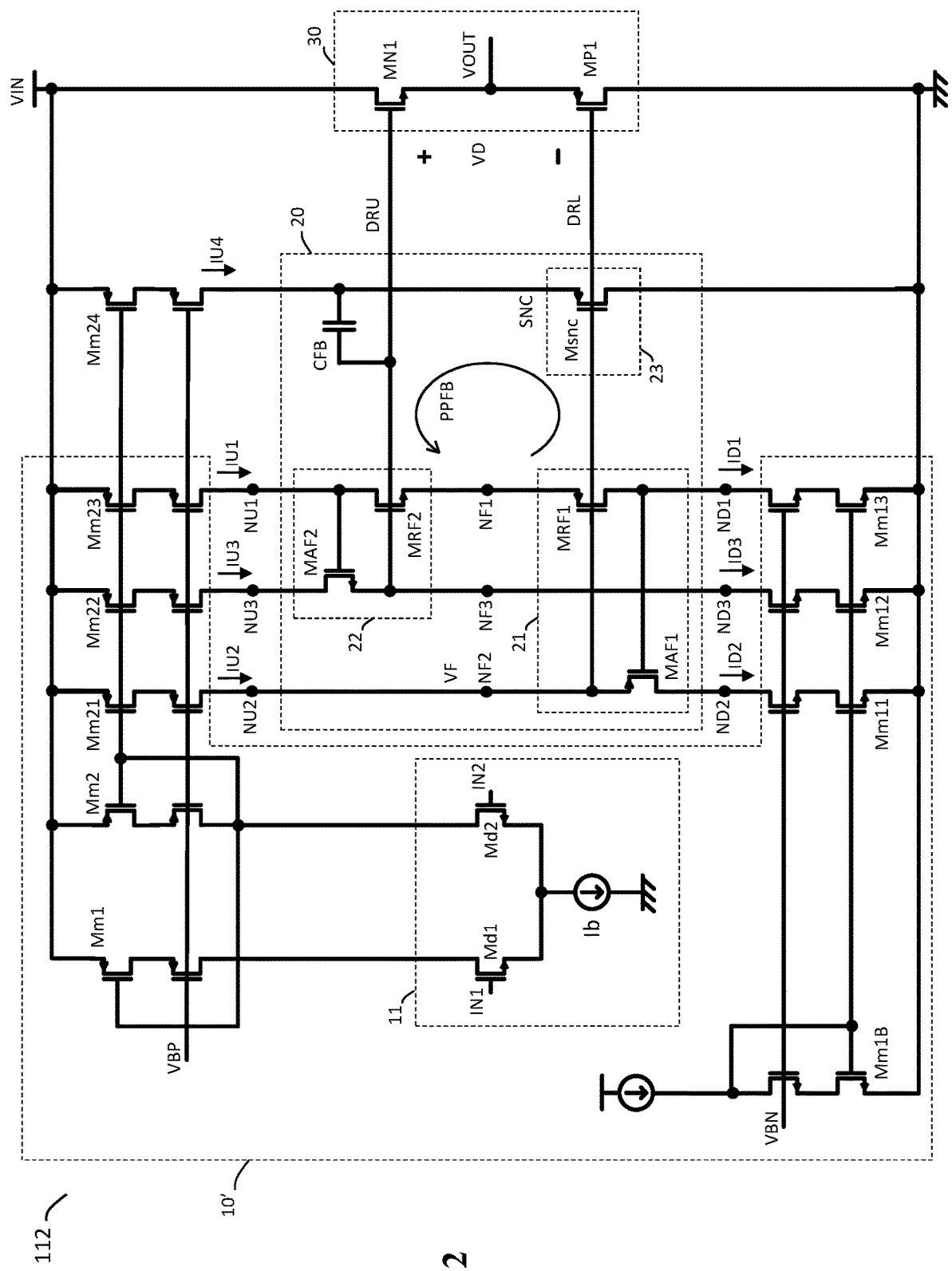
FIG. 12 shows a schematic diagram of a multi-stage amplifier circuit according to a specific embodiment of the present invention.

Please refer to FIG. 12, which shows a schematic diagram of a multi-stage amplifier circuit (i.e., multi-stage amplifier circuit 112) according to a specific embodiment of the present invention. The multi-stage amplifier circuit 112 of this embodiment shown in FIG. 12 is similar to the multi-stage amplifier circuit 103 shown in FIG. 3, but is different in that: in the multi-stage amplifier circuit 112 of this embodiment, the pre-stage amplifier 10' is not a fully differential transconductance amplifier circuit. More specifically, in this embodiment, the pre-stage amplifier 10' is configured to operably transconduct and amplify a voltage difference between the first input terminal IN1 and the second input terminal IN2, so as to generate plural pre-stage transconductance currents IU1-IUx; however, the pre-stage transconductance currents ID1-IDx at the pull side are a constant current loads. The multi-stage amplifier circuit 112 of this embodiment is also capable of generating the above-mentioned upper driving signal DRU and lower driving signal DRL and is capable of achieving all the aforementioned efficacies.

In summary, the present invention is advantageous in that: firstly, because the quiescent currents of the upper transistor MN1 and the lower transistor MP1 of the output stage circuit 30 are determined according to the offset current Ib of the differential amplification stage 11 of the pre-stage amplifier 10, the overall quiescent currents of the multi-stage amplifier circuit is under proper control, thus achieving high efficiency. Secondly, according to the present invention, because the internal control loop of the floating control circuit 20, including the reference voltages therein, are floating with reference to the voltages at the pre-stage transconductance nodes, the high gain provided by the pre-stage amplifier 10 and the floating level provided by the floating control circuit 20 help to achieve precise and high-speed control on the AB-stage output amplification circuit. Thirdly, the aforementioned voltage positive feedback loop PPFB can expedite in-phase response of the upper driving signal DRU and the lower driving signal DRL, thus expediting transient state response of the multi-stage amplifier circuit, while in the meantime, the stability of the whole multi-stage amplifier circuit is not compromised. In addition, because the floating control circuit 20 is floating with reference to the voltages at the pre-stage transconductance nodes, the aforementioned compensation capacitor CC can ensure the stability of the internal loop of the floating control circuit 20 without compromising the overall transient state response speed of the multi-stage amplifier circuit.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. For example, the first sub-floating control circuit and the second sub-floating control circuit can be each of a different embodiment described above. In view of the foregoing, the spirit of the present invention should cover all such and other modifications and variations, which should be interpreted to fall within the scope of the following claims and their equivalents.

What is claimed is:

1. A multi-stage amplifier circuit, comprising:
a pre-stage amplifier, which is configured to operably amplify a voltage difference between a first input terminal and a second input terminal of the pre-stage amplifier, so as to generate a plurality of pre-stage transconductance currents flowing through a plurality of corresponding pre-stage transconductance nodes, wherein the plurality of pre-stage transconductance currents include a first pre-stage transconductance current and a second pre-stage transconductance current which are in-phase with each other; and
a floating control circuit, which is configured to operably generate an upper driving signal and a lower driving signal according to the first pre-stage transconductance current and the second pre-stage transconductance current, wherein the floating control circuit includes a first sub-floating control circuit and a second sub-floating control circuit which are coupled to each other, wherein the first sub-floating control circuit and the second sub-floating control circuit are configured to operably generate a first sub-floating control signal and a second sub-floating control signal, respectively; wherein the first sub-floating control signal and the second sub-floating control signal correspond to one and the other of the upper driving signal and the lower driving signal, respectively;
wherein the first sub-floating control circuit includes:
a first floating reference transistor, which is configured to operably receive the first pre-stage transconductance current and which is configured as a source follower; and
a first floating amplifier, which is coupled to the first floating reference transistor to form a feedback control loop, wherein the first floating amplifier is configured to operably generate the first sub-floating control signal according to a floating reference level in the floating control circuit by feedback control;

wherein the first sub-floating control signal is configured to operably control a gate of the first floating reference transistor, and wherein the floating reference level is generated according to the second pre-stage transconductance current;

wherein the first sub-floating control signal and the second sub-floating control signal are floating with reference to voltages at the plurality of corresponding pre-stage transconductance nodes, and wherein there is a predetermined voltage difference between the first sub-floating control signal and the second sub-floating control signal, wherein the predetermined voltage difference is correlated with a gate-source voltage of the first floating reference transistor.

2. The multi-stage amplifier circuit of claim 1, wherein the predetermined voltage difference is determined according to the first pre-stage transconductance current.

3. The multi-stage amplifier circuit of claim 1, wherein the first sub-floating control circuit is configured as one of the following arrangements:

(1) the first floating amplifier is configured to operably regulate a drain voltage of the first floating reference transistor by feedback control, such that the drain voltage of the first floating reference transistor is correlated with the floating reference level in the floating control circuit, thereby generating the first sub-floating control signal; or (2) the first floating amplifier is configured to operably regulate a source voltage of the first floating reference transistor by feedback control, such that the source voltage of the first floating reference transistor is correlated with the floating reference level in the floating control circuit, thereby generating the first sub-floating control signal.

4. The multi-stage amplifier circuit of claim 1, wherein a power source and an offset current of the first floating amplifier are generated from one or more of the plurality of pre-stage transconductance currents other than the first pre-stage transconductance current.

5. The multi-stage amplifier circuit of claim 3, wherein the first sub-floating control circuit is configured as the arrangement (1); and wherein the first floating amplifier includes a first floating amplification transistor, which is configured as a source follower, wherein the first floating amplification transistor is offset by the second pre-stage transconductance current, wherein a gate of the first floating amplification transistor is configured to operably receive the drain voltage of the first floating reference transistor for feedback control, thus generating the first sub-floating control signal at a source of the first floating amplification transistor;

wherein the source of the first floating amplification transistor is configured to operably receive the second pre-stage transconductance current and generate the floating reference level.

6. The multi-stage amplifier circuit of claim 1, wherein all common mode voltages of the floating control circuit respond to the voltages of the plurality of corresponding pre-stage transconductance nodes in an in-phase manner.

7. The multi-stage amplifier circuit of claim 1, wherein the floating control circuit forms a super node with reference to the plurality of corresponding pre-stage transconductance nodes.

8. The multi-stage amplifier circuit of claim 6, wherein the floating control circuit further includes a compensation capacitor, which is coupled between a first internal node and a second internal node in the first floating amplifier;

wherein:

with reference to an outside of the first floating amplifier, a common mode voltage at the first internal node and a common mode voltage at the second internal node are respectively determined according to two of the plurality of pre-stage transconductance currents which are in-phase with one the other, and both the common mode voltage at the first internal node and the common mode voltage at the second internal node respond to the voltages of the plurality of corresponding pre-stage transconductance nodes in an in-phase manner; and with reference to an inside of the first floating amplifier, both the common mode voltage at the first internal node and the common mode voltage at the second internal node respond in a reversed-phase manner.

9. The multi-stage amplifier circuit of claim 8, wherein a bandwidth of transient state response of the floating control circuit is lower than a bandwidth of transient state response of the multi-stage amplifier circuit.

10. The multi-stage amplifier circuit of claim 1, wherein the floating control circuit further includes:

a synchronous amplifier, which is configured to operably generate a synchronous amplification signal according to one of the upper driving signal and the lower driving signal; and a feedback capacitor, which is configured to operably couple the synchronous amplification signal to the other one of the upper driving signal and the lower driving signal;

wherein the synchronous amplifier, the feedback capacitor, the second sub-floating control circuit and the first sub-floating control circuit constitute a voltage positive feedback loop, so as to expedite in-phase response of the upper driving signal and the lower driving signal, thus expediting transient state response of the multi-stage amplifier circuit.

11. The multi-stage amplifier circuit of claim 10, wherein the synchronous amplifier includes:

a synchronous transistor, which is offset by a third pre-stage transconductance current of the plurality of pre-stage transconductance currents, wherein the synchronous transistor is configured as a source follower, and wherein a gate of the synchronous transistor is configured to operably receive one of the upper driving signal and the lower driving signal, so as to generate the synchronous amplification signal at a source of the synchronous transistor;

wherein the synchronous transistor, the feedback capacitor, the second sub-floating control circuit and the first sub-floating control circuit constitute the voltage positive feedback loop.

12. The multi-stage amplifier circuit of claim 1, further comprising:

an output stage circuit, which is configured to operably generate an amplification output signal according to the upper driving signal and the lower driving signal, wherein the output stage circuit includes:

an upper transistor and a lower transistor, which are coupled to each other by a configuration of a source follower wherein a source of the upper transistor is coupled to a source of the lower transistor, such that the upper transistor and the lower transistor are configured as an AB-stage output amplification circuit, wherein the upper transistor and the lower transistor are controlled by the upper driving signal and the lower driving signal, respectively, so as to generate the amplification output signal.

13. The multi-stage amplifier circuit of claim 3, wherein the second sub-floating control circuit is configured as one of the following arrangements:
    (1) the second sub-floating control circuit includes:
        a second floating reference transistor, which is configured to operably receive the first pre-stage transconductance current and which is configured as a source follower; wherein a source of the first floating reference transistor is coupled to a source of the second floating reference transistor; and
        a second floating amplifier, which is configured to operably generate the second sub-floating control signal by feedback control according to the floating reference level in the floating control circuit; wherein the second sub-floating control signal is configured to operably control a gate of the second floating reference transistor; or
    (2) the second sub-floating control circuit includes:
        a floating control transistor, which is configured as a diode, wherein a source of the floating control transistor is coupled to the source of the first floating reference transistor, whereas, a drain of the floating control transistor is configured to operably generate the second sub-floating control signal.

14. The multi-stage amplifier circuit of claim 12, wherein quiescent currents of the upper transistor and the lower transistor are determined according to an offset current of a differential amplification stage of the pre-stage amplifier.

15. The multi-stage amplifier circuit of claim 1, wherein the pre-stage amplifier includes a plurality of push branches and a plurality of corresponding pull branches, wherein the floating control circuit is coupled between the plurality of push branches and the plurality of pull branches, and the floating control circuit is floating with reference to the plurality of push branches and the plurality of pull branches, wherein the plurality of pre-stage transconductance currents further include a fourth pre-stage transconductance current which is in reversed-phase with the first pre-stage transconductance current and a fifth pre-stage transconductance current which is in reversed-phase with the second pre-stage transconductance current; wherein the first pre-stage transconductance current and the fourth pre-stage transconductance current correspond to a first push branch of the plurality of push branches and a first pull branch of the plurality of pull branches, respectively, whereas, the second pre-stage transconductance current and the fifth pre-stage transconductance current correspond to a second push branch of the plurality of push branches and a second pull branch of the plurality of pull branches, respectively.

16. The multi-stage amplifier circuit of claim 1, wherein the pre-stage amplifier includes a plurality of push branches and a plurality of corresponding pull branches, wherein the floating control circuit is coupled between the plurality of push branches and the plurality of pull branches, and the floating control circuit is floating with reference to the plurality of push branches and the plurality of pull branches, wherein the pre-stage amplifier includes a first load current and a second load current, both of which have a constant current level; wherein the first pre-stage transconductance current and the first load current correspond to a first push branch of the plurality of push branches and a first pull branch of the plurality of pull branches, respectively, whereas, the second pre-stage transconductance current and the second load current correspond to a second push branch of the plurality of push branches and a second pull branch of the plurality of pull branches, respectively.

17. A multi-stage amplifier circuit, comprising:
    a pre-stage amplifier, which is configured to operably amplify a voltage difference between a first input terminal and a second input terminal, so as to generate a plurality of pre-stage transconductance currents flowing through a plurality of corresponding pre-stage transconductance nodes, wherein the plurality of pre-stage transconductance currents include a first pre-stage transconductance current and a second pre-stage transconductance current which are in-phase with each other; and
    a floating control circuit, which is configured to operably generate an upper driving signal and a lower driving signal according to the first pre-stage transconductance current and the second pre-stage transconductance current, wherein the floating control circuit includes a first sub-floating control circuit and a second sub-floating control circuit which are coupled to each other, wherein the first sub-floating control circuit and the second sub-floating control circuit are configured to operably generate a first sub-floating control signal and a second sub-floating control signal, respectively; wherein the first sub-floating control signal and the second sub-floating control signal correspond to one and the other one of the upper driving signal and the lower driving signal, respectively;
    wherein the first sub-floating control signal and the second sub-floating control signal are floating with reference to voltages at the plurality of corresponding pre-stage transconductance nodes, and wherein there is a predetermined voltage difference between the first sub-floating control signal and the second sub-floating control signal;
    wherein the floating control circuit includes:
        a synchronous amplifier, which is configured to operably generate a synchronous amplification signal according to one of the upper driving signal and the lower driving signal; and
        a feedback capacitor, which is configured to operably couple the synchronous amplification signal to the other one of the upper driving signal and the lower driving signal;
    wherein the synchronous amplifier, the feedback capacitor, the second sub-floating control circuit and the first sub-floating control circuit constitute a voltage positive feedback loop, so as to expedite in-phase response of the upper driving signal and the lower driving signal, thus expediting transient state response of the multi-stage amplifier circuit.

18. The multi-stage amplifier circuit of claim 17, wherein the synchronous amplifier includes:
    a synchronous transistor, which is offset by a third pre-stage transconductance current of the plurality of pre-stage transconductance currents, wherein the synchronous transistor is configured as a source follower, and wherein a gate of the synchronous transistor is configured to operably receive one of the upper driving signal and the lower driving signal, so as to generate the synchronous amplification signal at a source of the synchronous transistor;
    wherein the synchronous transistor, the feedback capacitor, the second sub-floating control circuit and the first sub-floating control circuit constitute the voltage positive feedback loop.

19. The multi-stage amplifier circuit of claim 17, further comprising:

an output stage circuit, which is configured to operably generate an amplification output signal according to the upper driving signal and the lower driving signal, wherein the output stage circuit includes:

an upper transistor and a lower transistor, which are coupled to each other by a configuration of a source follower wherein a source of the upper transistor is coupled to a source of the lower transistor, such that the upper transistor and the lower transistor are configured as an AB-stage output amplification circuit, wherein the upper transistor and the lower transistor are controlled by the upper driving signal and the lower driving signal, respectively, so as to generate the amplification output signal.

* * * * *